US009202537B2

(12) United States Patent
Takahashi et al.

(10) Patent No.: US 9,202,537 B2
(45) Date of Patent: Dec. 1, 2015

(54) SEMICONDUCTOR MEMORY DEVICE

(71) Applicant: Renesas Electronics Corporation, Kawasaki-shi (JP)

(72) Inventors: Hiroyuki Takahashi, Kawasaki (JP); Satoshi Mochimaru, Yokohama (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 192 days.

(21) Appl. No.: 14/054,467

(22) Filed: Oct. 15, 2013

(65) Prior Publication Data
US 2014/0104971 A1    Apr. 17, 2014

(30) Foreign Application Priority Data

Oct. 17, 2012 (JP) .................. 2012-229906

(51) Int. Cl.
| H01L 27/07 | (2006.01) |
| H01L 27/108 | (2006.01) |
| G11C 7/06 | (2006.01) |
| G11C 7/12 | (2006.01) |
| G11C 7/10 | (2006.01) |
| H01L 27/02 | (2006.01) |

(52) U.S. Cl.
CPC ...... *G11C 7/12* (2013.01); *G11C 7/065* (2013.01); *G11C 7/1072* (2013.01); *H01L 27/0207* (2013.01); *H01L 27/10897* (2013.01)

(58) Field of Classification Search
CPC .............. H01L 27/10897; H01L 27/0705; H01L 27/0207; G11C 7/06; G11C 7/065; G11C 7/12
See application file for complete search history.

(56) References Cited

U.S. PATENT DOCUMENTS

| 6,198,128 B1 * | 3/2001 | Asakura et al. ............... 257/337 |
| 6,535,453 B2 * | 3/2003 | Nii et al. .................. 365/230.05 |
| 6,839,283 B1 * | 1/2005 | Futatsuyama et al. ... 365/185.23 |
| 7,102,947 B2 | 9/2006 | Kajitani et al. |
| 7,245,534 B2 * | 7/2007 | Goda et al. ............... 365/185.17 |
| 7,251,176 B2 | 7/2007 | Kajitani et al. |
| 7,414,907 B2 | 8/2008 | Kajitani et al. |
| 7,585,745 B2 * | 9/2009 | Adachi et al. .................. 438/424 |
| 7,679,144 B2 * | 3/2010 | Kudo et al. .................... 257/393 |
| 2009/0090973 A1 * | 4/2009 | Tohata et al. ................. 257/368 |

FOREIGN PATENT DOCUMENTS

| JP | H 10-303387 A | 11/1998 |
| JP | 2005-322380 A | 11/2005 |

* cited by examiner

*Primary Examiner* — Allison P Bernstein
(74) *Attorney, Agent, or Firm* — McGinn IP Law Group, PLLC

(57) ABSTRACT

A semiconductor memory device includes a sense amplifier section. The sense amplifier section includes first n-type diffusion layers, second n-type diffusion layers, first to fifth gates, and first to eighth contacts. The first to fourth contacts are formed over the first n-type diffusion layers. The fifth to eighth contacts are formed over the second n-type diffusion layers. The first and fourth gates are formed in a region between the first n-type diffusion layers. The third gate is formed in a region between the first n-type diffusion layers and in a region between the second n-type diffusion layers. The second and fifth gates are formed in a region between the second n-type diffusion layers.

20 Claims, 24 Drawing Sheets

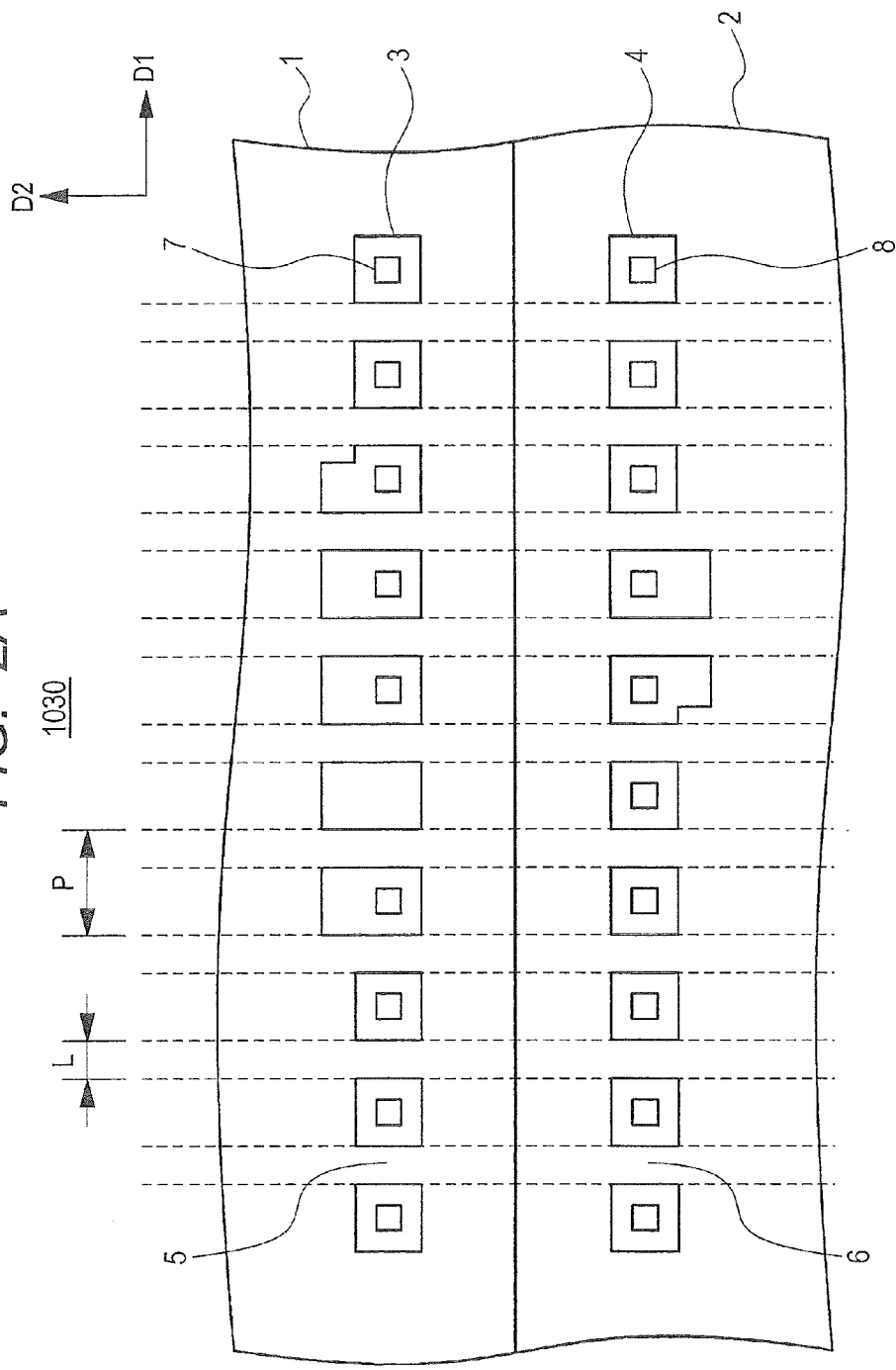

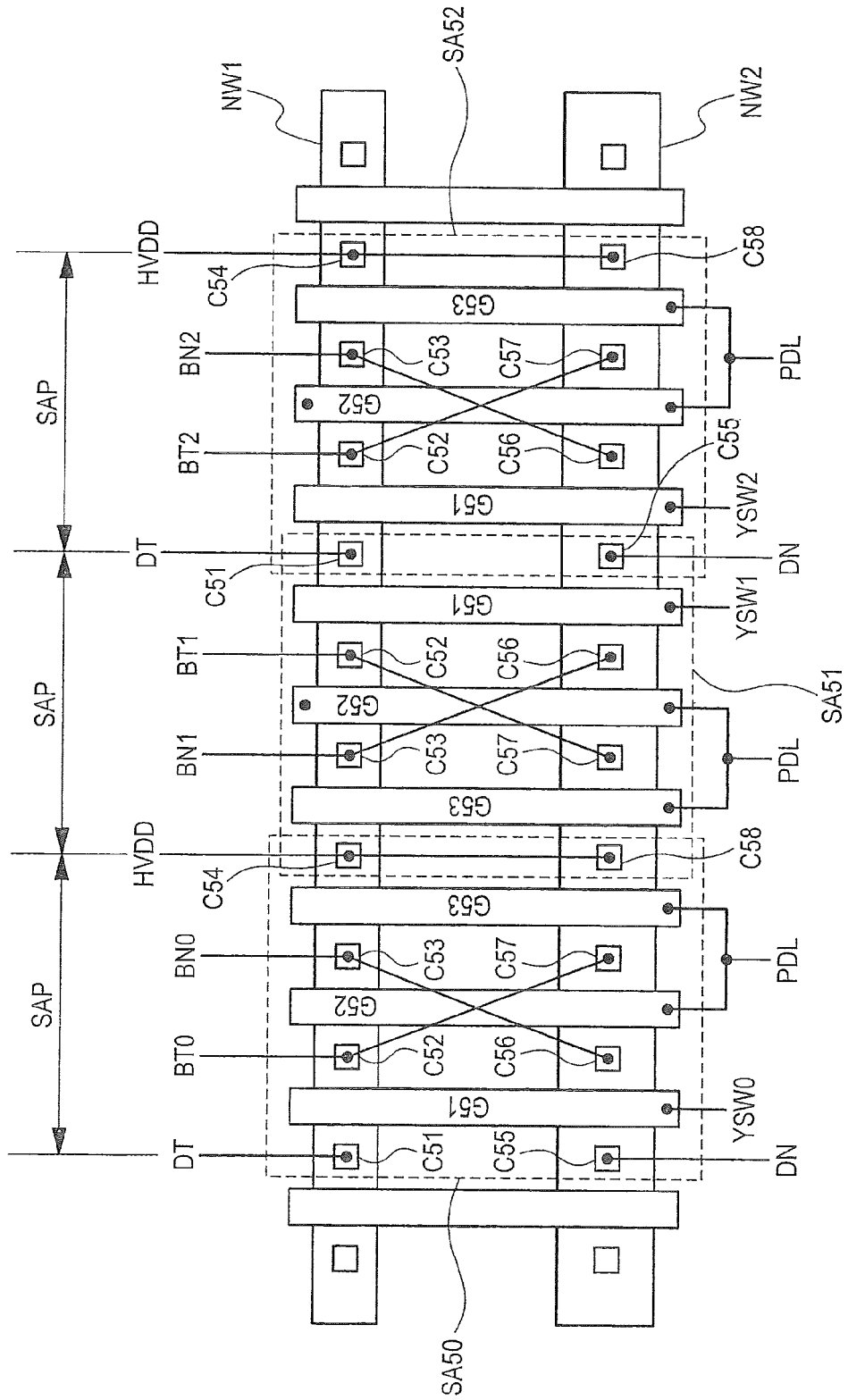

SEMICONDUCTOR MEMORY DEVICE

CROSS-REFERENCE TO RELATED APPLICATIONS

The disclosure of Japanese Patent Application No. 2012-229906 filed on Oct. 17, 2012 including the specification, drawings, and abstract is incorporated herein by reference in its entirety.

BACKGROUND

The present invention relates to a semiconductor memory device, and more particularly, to a semiconductor memory device such as a dynamic random access memory (DRAM).

A sense amplifier (hereinafter referred to as the SA) region of a DRAM has the second largest area ratio next to a memory cell. Hence, reducing the layout area of the sense amplifier region is important for cost reduction. It is therefore necessary that a sense amplifier circuit element be compressed and disposed within a narrow cell pitch. Layout compression is generally achieved by providing the gate and source/drain diffusion layer of a transistor with a special layout form that is different from the layout form of a common logic circuit region.

For example, a semiconductor memory device proposed in Japanese Unexamined Patent Publication No. Hei 10 (1998)-303387 is capable of reducing the planar area of a region where a sense amplifier circuit is formed. Further, a variety of exemplary configurations of a common sense amplifier are proposed, for instance, in Japanese Unexamined Patent Publication No. 2005-322380.

SUMMARY

However, the inventors of the present invention have found a problem with the above-mentioned related art method. In some cases, the above-mentioned method for compressing the layout area may not sufficiently reduce the layout area because of recent progress in process miniaturization. Consequently, it is now demanded that a layout compression method for semiconductor memory devices be developed to support future progress in miniaturization.

Other problems and novel features will become apparent from the following description and from the accompanying drawings.

According to one aspect of the present invention, there is provided a semiconductor memory device including a sense amplifier section. The sense amplifier section includes a plurality of first diffusion layers, a plurality of second diffusion layers, a plurality of first regions, a plurality of second regions, a plurality of contacts, and a plurality of gates. The first diffusion layers are formed over a semiconductor layer and disposed at predetermined intervals in a first direction. The second diffusion layers are formed over the semiconductor layer, isolated from the first diffusion layers in a second direction, and disposed at the predetermined intervals in the first direction. The first regions have a predetermined width for separating the first diffusion layers from each other. The second regions align with the first regions in the second direction and have the predetermined width for separating the second diffusion layers from each other. The contacts are formed over the first diffusion layers and over the second diffusion layers. The gates are long in the second direction and formed over one or both of the semiconductor layer exposed by the first region and the semiconductor layer exposed by the second region.

One aspect of the present invention makes it possible to provide a semiconductor memory device that is capable of effectively reducing the layout area.

BRIEF DESCRIPTION OF THE DRAWINGS

Embodiments of the present invention will be described in detail based on the following figures, in which:

FIG. 2A is a schematic layout diagram illustrating design rules for the semiconductor memory device according to the first embodiment;

FIG. 7A is a schematic layout diagram illustrating the configuration of essential parts of the sense amplifier section according to a fifth embodiment;

DETAILED DESCRIPTION

Figure 1:
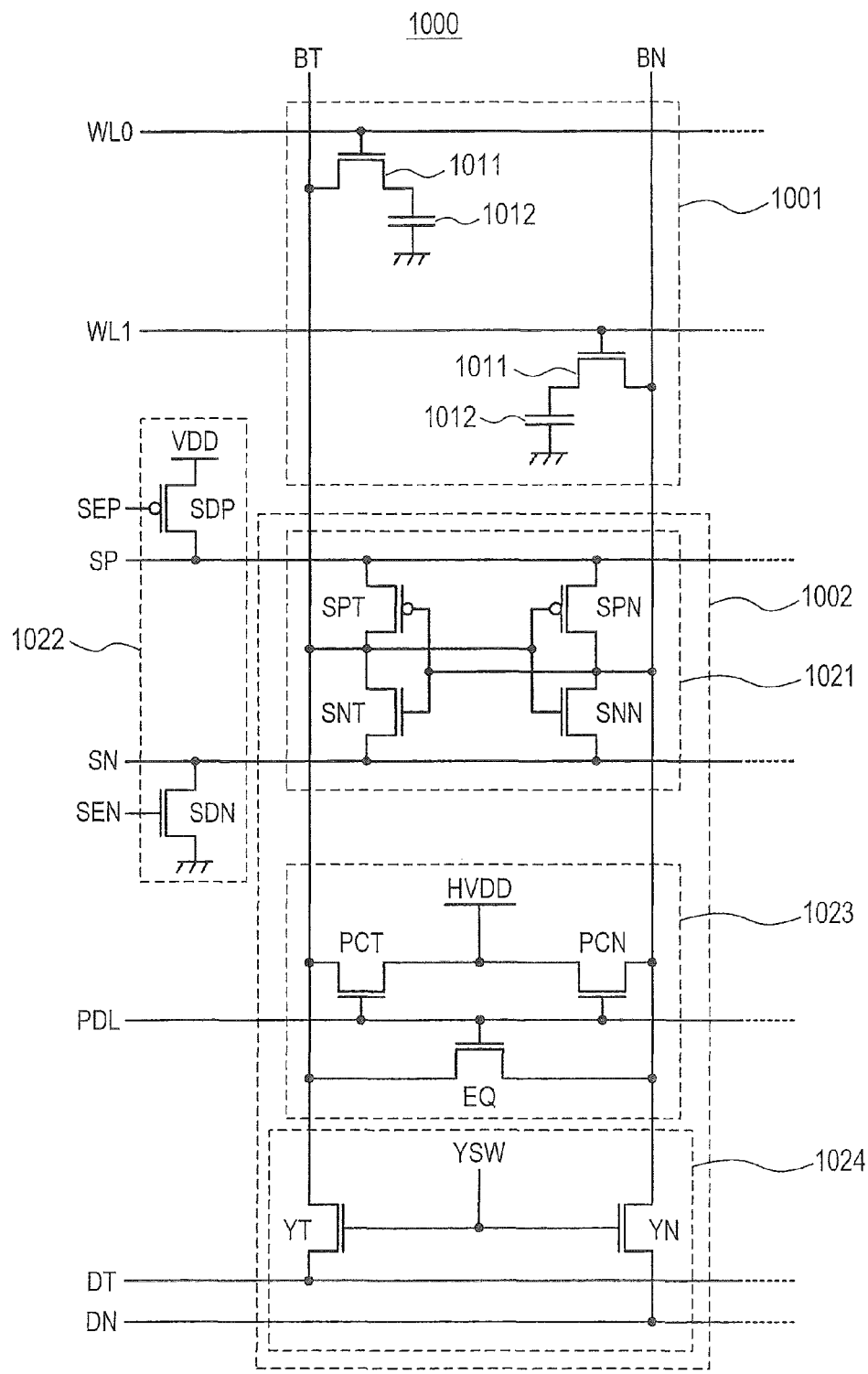
FIG. 1 is a circuit diagram illustrating an exemplary configuration of a semiconductor memory device 1000 according to a first embodiment.

Embodiments of the present invention will now be described with reference to the accompanying drawings. Like elements are designated by like reference numerals throughout the drawings and redundant description thereof is omitted as appropriate.

First Embodiment

First of all, a semiconductor memory device according to a first embodiment of the present invention will be described. FIG. 1 is a circuit diagram illustrating an exemplary configuration of the semiconductor memory device 1000 according to the first embodiment. The semiconductor memory device 1000 includes a memory cell section 1001 and a sense amplifier section 1002, which are coupled to a pair of bit lines BT, BN.

The memory cell section 1001 includes a plurality of transistors 1011, which form a memory cell. The gates of the transistors 1011 are respectively coupled to word lines (word lines WL0, WL1). In the memory cell section 1001, a line selection is made in accordance with signals given to the word lines WL0, WL1. One ends of the transistors 1011 are coupled to the bit line BT or the bit line BN. The other ends of the transistors 1011 are grounded through a capacitor 1012. The bit lines BT, BN are referred to also as the first bit line and the second bit line, respectively. However, the first bit line may be the bit line BN, and the second bit line may be the bit line BT. The gates of an Nch transistor and of a Pch transistor may be hereinafter simply referred to as control terminals.

The sense amplifier section 1002 includes an amplifier section 1021, a sense amplifier driver 1022, a precharge section 1023, and a Y switch section 1024. The amplifier section 1021 includes Pch transistors SPT, SPN and Nch transistors SNT, SNN. The Pch transistor SPT and the Nch transistor SNT form an inverter INVT. The Pch transistor SPN and the Nch transistor SNN form an inverter INVN.

The source of the Pch transistor SPT is coupled to a common source line SP, and the drain is coupled to the drain of the Nch transistor SNT. The source of the Nch transistor SNT is coupled to a common source line SN. A node between the drain of the Pch transistor SPT and the drain of the Nch transistor SNT serves as the output of the inverter INVT. The gate of the Pch transistor SPT and the gate of the Nch transistor SNT serve as the input of the inverter INVT.

The source of the Pch transistor SPN is coupled to the common source line SP, and the drain is coupled to the drain of the Nch transistor SNN. The source of the Nch transistor SNN is coupled to the common source line SN. A node between the drain of the Pch transistor SPN and the drain of the Nch transistor SNN serves as the output of the inverter INVN. The gate of the Pch transistor SPN and the gate of the Nch transistor SNN serve as the input of the inverter INVN.

The output of the inverter INVT (the node between the drain of the Pch transistor SPT and the drain of the Nch transistor SNT) and the input of the inverter INVN (the gate of the Pch transistor SPN and the gate of the Nch transistor SNN) are coupled to the bit line BT. The output of the inverter INVN (the node between the drain of the Pch transistor SPN and the drain of the Nch transistor SNN) and the input of the inverter INVT (the gate of the Pch transistor SPT and the gate of the Nch transistor SNT) are coupled to the bit line BN. In other words, the inverter INVT and the inverter INVN form a latch circuit whose input and output are intercoupled to retain signals of the bit lines BT, BN.

The sense amplifier driver 1022 includes a Pch transistor SDP and an Nch transistor SDN. The source of the Pch transistor SDP is coupled to a power supply VDD, and the drain is coupled to the common source line SP. A sense amplifier control signal SEP is applied to the gate of the Pch transistor SDP. The source of the Nch transistor SDN is coupled to a ground GND, and the drain is coupled to the common source line SN. A sense amplifier control signal SEN is applied to the gate of the Nch transistor SDN. The sense amplifier control signals SEP, SEN act, for example, as a pair of differential signals. Therefore, the Pch transistor SDP and the Nch transistor SDN turn on and off in synchronism with each other. The common source lines SP, SN are referred to also as the first common line and the second common line, respectively. The sense amplifier control signal SEP and the sense amplifier control signal SEN are referred to also as the first sense amplifier control signal and the second sense amplifier control signal, respectively. However, the first common line may be the common source line SN, and the second common line may be the common source line SP. In such an instance, the sense amplifier control signal SEN serves as the first sense amplifier control signal and the sense amplifier control signal SEP serves as the second sense amplifier control signal.

The precharge section 1023 includes Nch transistors PCT, PCN and an equalizer circuit EQ. The Nch transistors PCT, PCN are elements that precharge the bit lines BT, BN to a voltage of ½ VDD while the sense amplifier section 1002 is inactive. The Nch transistor PCT is coupled between the bit line BT and a power supply HVDD (½ VDD). The Nch transistor PCN is coupled between the bit line BN and the power supply HVDD (½ VDD). The equalizer circuit EQ is an element that rapidly equalizes the potentials of the bit lines BT, BN.

The equalizer circuit EQ is coupled between the bit line BT and the bit line BN. The equalizer circuit EQ is configured as an NMOS transfer gate. In other words, the equalizer circuit EQ functions as a switch that electrically couples or uncouples the bit lines BT, BN.

A precharge control signal PDL is applied to the gates of the Nch transistors PCT, PCN and to a control terminal of the equalizer circuit EQ. Therefore, the Nch transistors PCT, PCN and the equalizer circuit EQ turn on and off in synchronism with each other. The precharge control signal PDL is referred to also as the first control signal.

The Y switch section 1024 includes Nch transistors YT, YN. The Nch transistor YT is coupled between the bit line BT and a bus line DT. The Nch transistor YN is coupled between the bit line BN and a bus line DN. A Y switch control signal YSW is applied to the gates of the Nch transistors YT, YN. The bus lines DT, DN are referred to also as the first but line and the second bus line, respectively. However, the first bus line may be the bus line DN, and the second bus line may be the bus line DT. The Y switch control signal YSW is referred to also as the second control signal.

For the sake of brevity, FIG. 1 shows only one pair of bit lines (BT, BN). However, a plurality of pairs of bit lines may be disposed.

In the present embodiment, the semiconductor memory device is laid out in accordance with predetermined design rules. FIG. 2A is a schematic layout diagram illustrating the design rules for the semiconductor memory device according to the first embodiment. A semiconductor memory device 1030 shown in FIG. 2A is an example for describing the design rules for the semiconductor memory device. It is assumed that the design rules for the semiconductor memory device 1030 are applied to the semiconductor memory device described below. In the semiconductor memory device 1030, the layout area for transistors is reduced by disposing the transistors in such a manner that their shapes are periodically aligned. This makes it possible to enhance the accuracy of processing, refine arrangement-related design criteria (for parts and the minimum distance between the parts), and increases circuit density.

The semiconductor memory device 1030 is configured so that an n-type semiconductor layer 1 and a p-type semiconductor layer 2 are formed over a semiconductor substrate (not shown). P-type diffusion layers 3 are formed over the n-type semiconductor layer 1 and aligned in a predetermined direction (direction D1 in FIG. 2A and referred to also as the first direction). The p-type diffusion layers 3 are disposed at a predetermined pitch P so that a region 5 having no gate and corresponding to a spacing interval L is provided as a space between them. A contact 7 is formed over each p-type diffusion layer 3. However, there may be a p-type diffusion layer 3 over which the contact 7 is not formed.

N-type diffusion layers 4 are formed over the p-type semiconductor layer 2 and aligned in the same direction as the p-type diffusion layers 3 (direction D1 in FIG. 2A). The n-type diffusion layers 4 are disposed at the predetermined pitch P so that a region 6 having no gate and corresponding to the spacing interval L is provided as a space between them. The regions 5, 6 are aligned in direction D2 (referred to also as the second direction), which is a direction orthogonal to direction D1 in FIG. 2A. A contact 8 is formed over each n-type diffusion layer 4. However, there may be an n-type diffusion layer 4 over which the contact 8 is not formed.

Figure 2B:
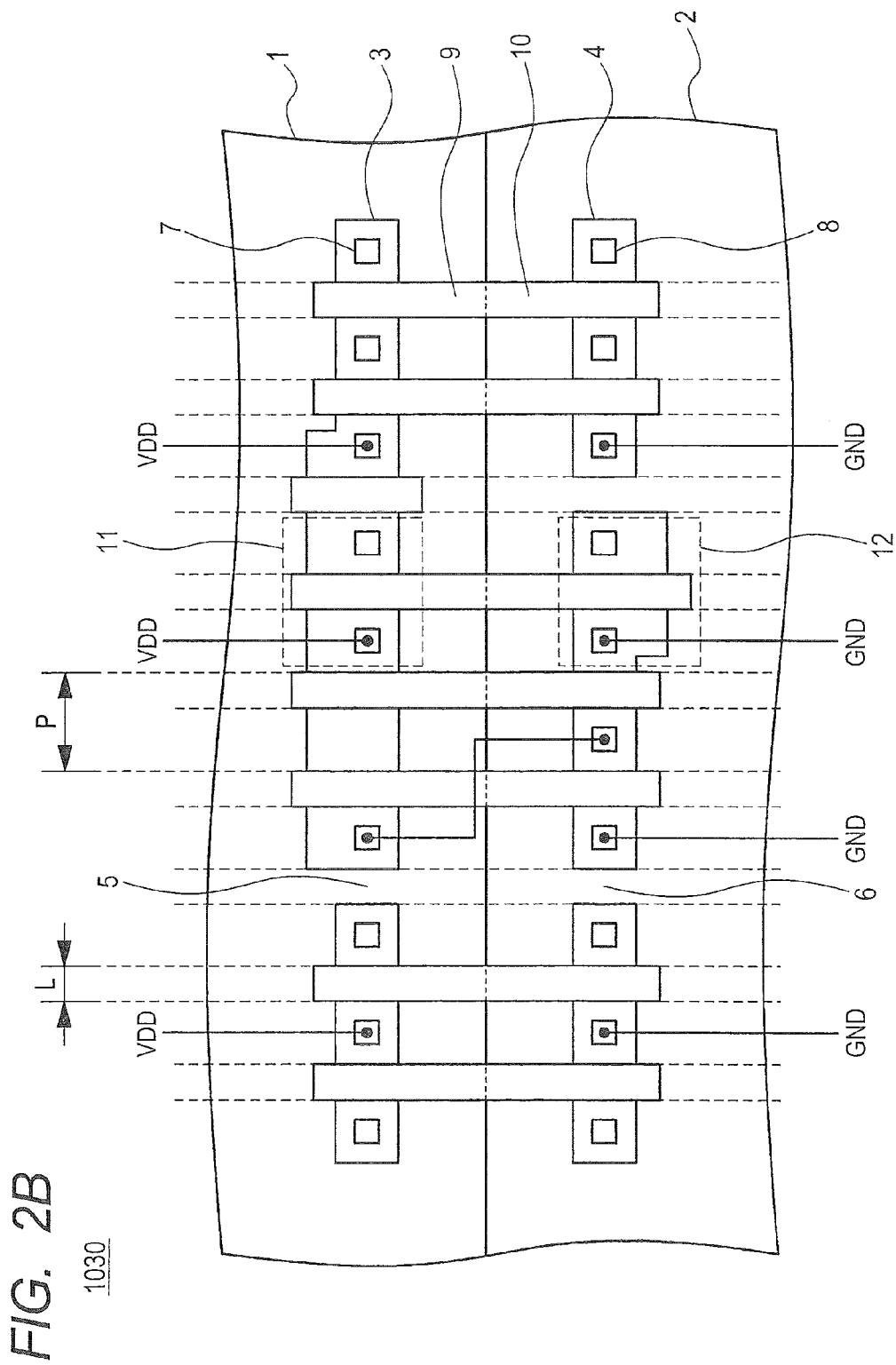
FIG. 2B is a schematic layout diagram illustrating the gate arrangement of a semiconductor memory device 1030.

FIG. 2B is a schematic layout diagram illustrating the gate arrangement of the semiconductor memory device 1030. A gate 9 is formed in the region 5. Hence, two p-type diffusion layers 3 sandwiching the region 5 serve as a source and a drain, respectively, and the n-type semiconductor layer 1 immediately below the gate 9 serves as a channel layer. This results in the formation of a Pch transistor 11. A gate 10 is formed in the region 6. Hence, two n-type diffusion layers 4 sandwiching the region 6 serve as a source and a drain, respectively, and the p-type semiconductor layer 2 immediately below the gate 10 serves as a channel layer. This results in the formation of an Nch transistor 12.

However, there may be a region 5 in which the gate 9 is not formed. Further, there may be a region 6 in which the gate 10 is not formed. In such an instance, the regions in which the gates 9, 10 are not formed can be easily formed by uniformly forming the gates 9, 10 and then removing relevant portions of the gates 9, 10 by etching.

The gates 9, 10 are aligned in direction D2. Therefore, the gates 9, 10 may be coupled to each other and formed as a single gate. The gates 9, 10, which have been described above, are disposed at a uniform pitch P and spaced at an interval of L, which corresponds to a channel length. The contacts 7, 8 are coupled as appropriate to the power supply VDD, the ground GND, and the like.

Figure 3A:
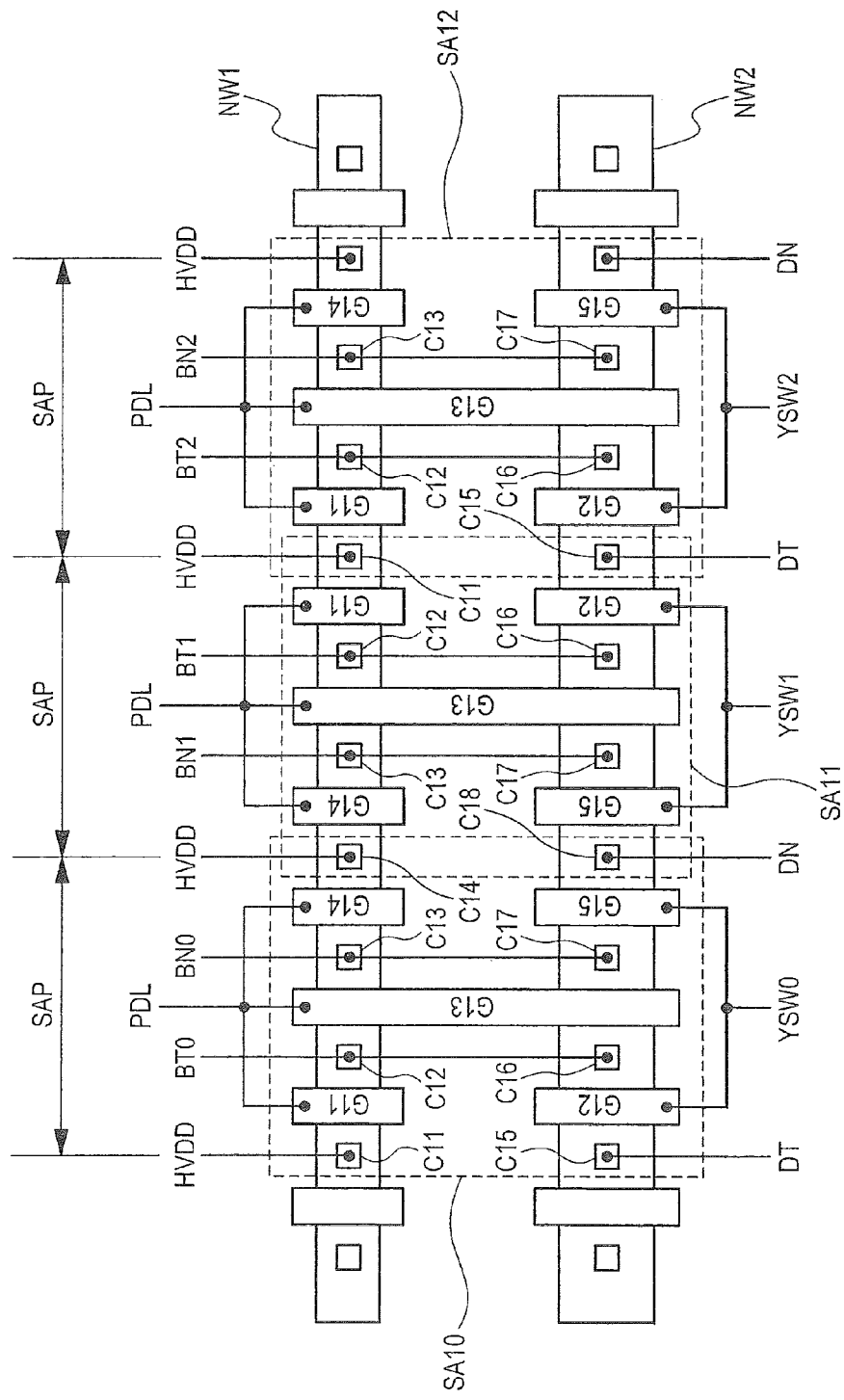
FIG. 3A is a schematic layout diagram illustrating the configuration of essential parts of a sense amplifier section according to the first embodiment.

The configuration of the sense amplifier section of the semiconductor memory device according to the first embodiment will now be described in detail on the basis of the above-described design rules for the semiconductor memory device. FIG. 3A is a schematic layout diagram illustrating the configuration of essential parts of the sense amplifier section according to the first embodiment. FIG. 3A shows an example in which three sense amplifier sections SA10 to SA12 are parallelly disposed. The present embodiment will be described with attention paid to the precharge section and Y switch section of the sense amplifier sections SA10 to SA12. For the sake of brevity, FIG. 3A shows n-type diffusion layers only and depicts only an Nch transistor that uses the n-type diffusion layers as a source and a drain. In other words, a Pch transistor, which is not shown, is disposed in the same manner as the Nch transistor. It should be noted that SAP denotes a sense amplifier pitch at which the sense amplifier sections are disposed.

The sense amplifier sections SA10 to SA12 are formed over the n-type diffusion layers NW1, NW2. Bit lines BT0 to BT2 each correspond to the bit line BT in FIG. 1. Bit lines BN0 to BN2 each correspond to the bit line BN in FIG. 1. Y switch control signals YSW0 to YSW2 each correspond to the Y switch control signal YSW in FIG. 1. The configuration of the sense amplifier section SA10 will be described below as a representative The sense amplifier section SA10 includes gates G11 to G15 and contacts C11 to C18. The gate G13 is formed across two regions, one region being a region where the n-type diffusion layer NW1 is disposed, the other region being a region where the n-type diffusion layer NW2 is disposed. The gate G11 is positioned to the left of the gate G13 and formed in a region where the n-type diffusion layer NW1 is not formed. The gate G12 is positioned to the left of the gate G13 and formed in a region where the n-type diffusion layer NW2 is not formed. The gate G14 is positioned to the right of the gate G13 and formed in a region where the n-type diffusion layer NW1 is not formed. The gate G15 is positioned to the right of the gate G13 and formed in a region where the n-type diffusion layer NW2 is not formed. A region sandwiched between two n-type diffusion layers NW1, where the n-type diffusion layer NW1 is not formed, is referred to also as the first region. A region sandwiched between two n-type diffusion layers NW2, where the n-type diffusion layer NW2 is not formed, is referred to also as the second region.

The contact C11 is formed over the n-type diffusion layer NW1 that is positioned to the left of the gate G11. The contact C12 is formed over the n-type diffusion layer NW1 that is positioned between the gate G11 and the gate G13. The contact C13 is formed over the n-type diffusion layer NW1 that is positioned between the gate G13 and the gate G14. The contact C14 is formed over the n-type diffusion layer NW1 that is positioned to the left of the gate G14. The contact C15 is formed over the n-type diffusion layer NW2 that is positioned to the left of the gate G12. The contact C16 is formed over the n-type diffusion layer NW2 that is positioned between the gate G12 and the gate G13. The contact C17 is formed over the n-type diffusion layer NW2 that is positioned between the gate G13 and the gate G15. The contact C18 is formed over the n-type diffusion layer NW2 that is positioned to the right of the gate G15.

The contacts C11, C14 are coupled to the power supply HVDD (½ VDD). The contacts C12, C16 are coupled to the bit line BT0. The contacts C13, C17 are coupled to the bit line BN0. The contact C15 is coupled to the bus line DT. The contact C18 is coupled to the bus line DN. The precharge control signal PDL is applied to the gates G11, G13, G14. The Y switch control signal YSW0 is applied to the gates G12, G15.

Figure 3B:
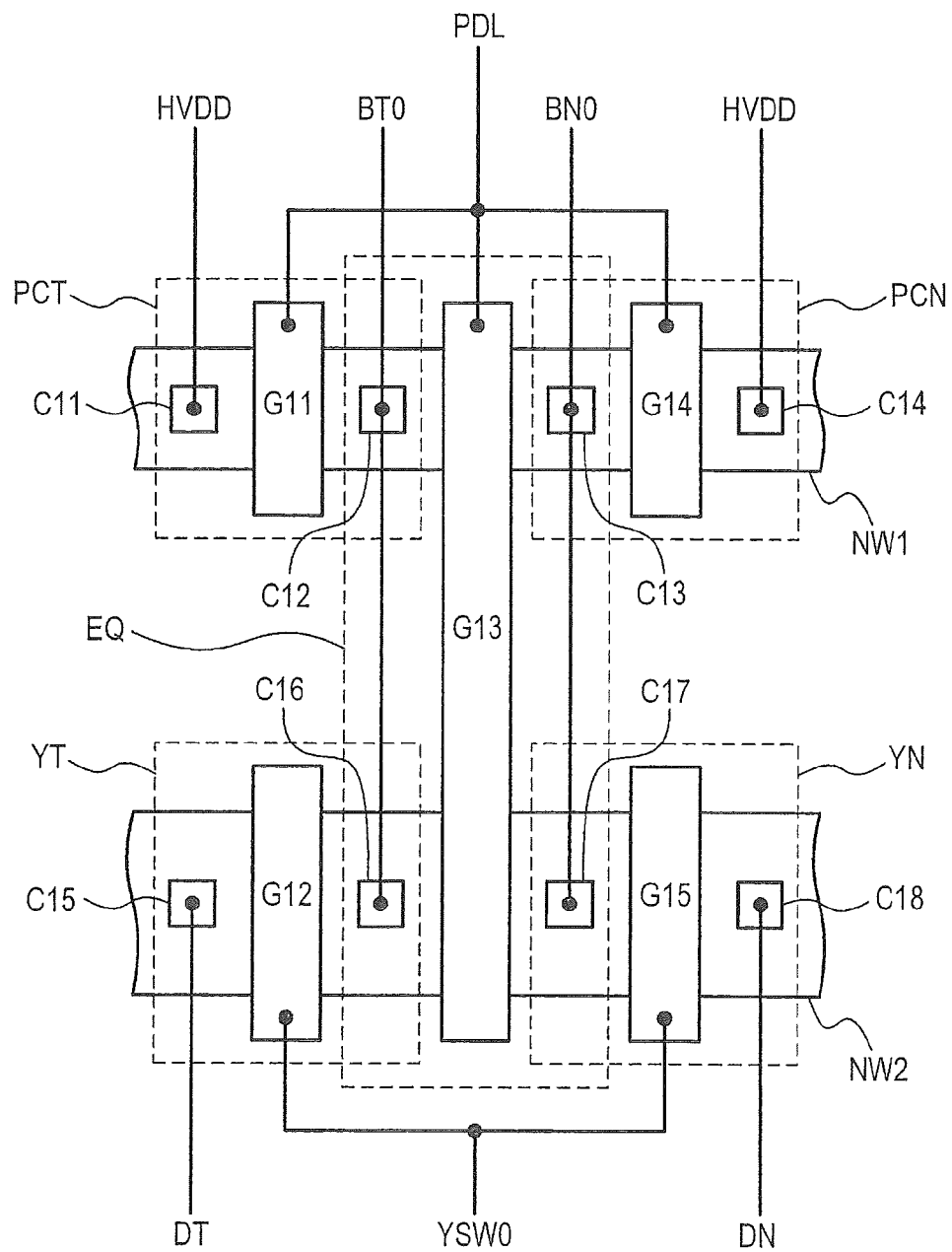
FIG. 3B is a layout diagram illustrating the transistor arrangement of a sense amplifier section SA10.

FIG. 3B is a layout diagram illustrating the transistor arrangement of the sense amplifier section SA10. The gate G11 and the contacts C11, C12 form the Nch transistor PCT (hereinafter may be referred to as the first transistor). The gate G14 and the contacts C13, C14 form the Nch transistor PCN (hereinafter may be referred to as the second transistor). The gate G13 and the contacts C12, C13, C16, C17 form the equalizer circuit EQ. In other words, the equalizer circuit EQ is configured as an Nch transistor having a greater channel width than the Nch transistors PCT, PCN. The gate G12 and the contacts C15, C16 form the Nch transistor YT (hereinafter may be referred to as the third transistor). The gate G15 and the contacts C17, C18 form the Nch transistor YN (hereinafter may be referred to as the fourth transistor).

From the above, it can be understood that the sense amplifier section SA10 includes the precharge section 1023 and Y switch section 1024 shown in FIG. 1.

The sense amplifier section SA12 has the same configuration as the sense amplifier section SA10. The sense amplifier section SA11 is configured by inverting the sense amplifier sections SA10, SA12 left to right. Hence, the configurations of the sense amplifier sections SA11, SA12 will not be described in detail.

The sense amplifier sections SA10, SA11 share the contacts C14, C18. The sense amplifier sections SA11, SA12 share the contacts C11, C15. As described above, one sense amplifier section shares one or both of a contact pair formed by the contacts C11, C15 and a contact pair formed by the contacts C14, C18 with a neighboring sense amplifier section. As a result, the sense amplifier sections can be densely disposed in a small area.

When gates having the same gate length are disposed at the same pitch, the above-described configuration makes it possible to implement the precharge section and Y switch section of the sense amplifier sections in a minimum area. Further, the above-described configuration makes it possible to increase the gate width of the equalizer circuit EQ. Therefore, the potentials of the paired bit lines can be rapidly equalized at the time of equalization.

Second Embodiment

Figure 4A:
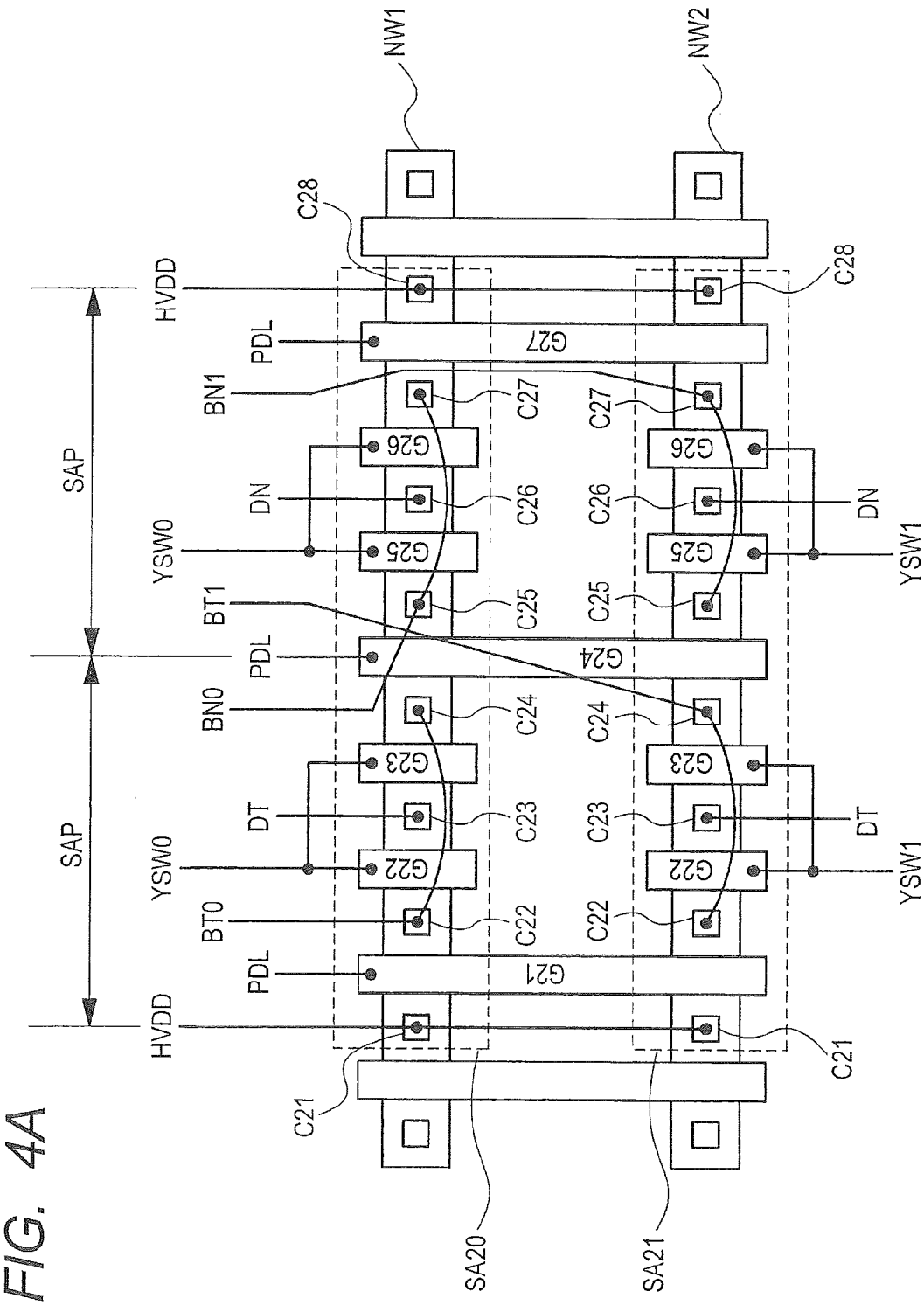
FIG. 4A is a schematic layout diagram illustrating the configuration of essential parts of the sense amplifier section according to a second embodiment.

Next, the semiconductor memory device according to a second embodiment of the present invention will be described. FIG. 4A is a schematic layout diagram illustrating the configuration of essential parts of the sense amplifier section according to the second embodiment. FIG. 4A shows an example in which two sense amplifier sections SA20, SA21 are parallelly disposed. As is the case with the first embodiment, the present embodiment will be described with attention paid to the precharge section and Y switch section of the sense amplifier sections SA20, SA21. For the sake of brevity, FIG. 4A shows n-type diffusion layers only and depicts only an Nch transistor that uses the n-type diffusion layers as a source and a drain.

The sense amplifier section SA20 is formed over the n-type diffusion layer NW1, and the sense amplifier section SA21 is formed over the n-type diffusion layer NW2. The bit lines BT0, BT1 each correspond to the bit line BT in FIG. 1. The bit lines BN0, BN1 each correspond to the bit line BN in FIG. 1. The Y switch control signals YSW0, YSW1 each correspond to the Y switch control signal YSW in FIG. 1. The configuration of the sense amplifier section SA20 will be described below as a representative.

The sense amplifier section SA20 includes gates G21 to G27 and contacts C21 to C28. The contacts C21 to C28 are sequentially formed over the n-type diffusion layer NW1 in alignment with each other. The gates G21 to G27 are respectively positioned between the contacts C21 to C27 and the contacts C22 to C28 and formed in a region where the n-type diffusion layer NW1 is not formed. However, the gates G21, G24, G27 are extended to the sense amplifier section SA21. In other words, the sense amplifier sections SA20, SA21 share the gates G21, G24, G27.

Figure 4B:
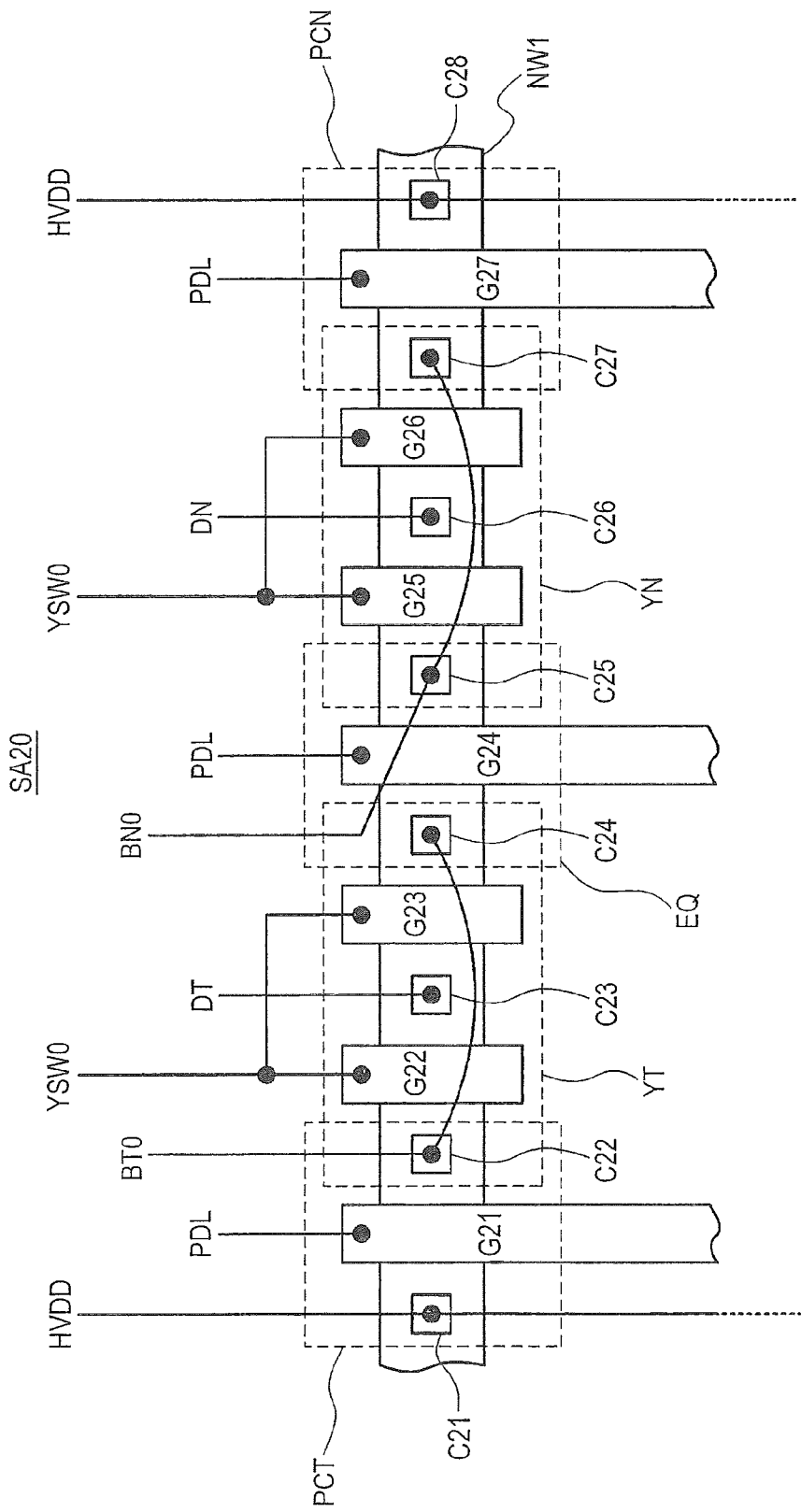
FIG. 4B is a layout diagram illustrating the transistor arrangement of a sense amplifier section SA20.

FIG. 4B is a layout diagram illustrating the transistor arrangement of the sense amplifier section SA20. The contacts C21, C28 are coupled to the power supply HVDD (½ VDD). The contacts C22, C24 are coupled to the bit line BT0. The contacts C25, C27 are coupled to the bit line BN0. The contact C23 is coupled to the bus line DT. The contact C26 is coupled to the bus line DN. The precharge control signal PDL is applied to the gates G21, G24, G27. The Y switch control signal YSW0 is applied to the gates G22, G23, G25, G26.

The gate G21 and the contacts C21, C22 form the Nch transistor PCT. The gate G27 and the contacts C27, C28 form the Nch transistor PCN. The gate G24 and the contacts C24, C25 form the equalizer circuit EQ. The gates G22, G23 and the contacts C22 to C24 form the Nch transistor YT. The gates G25, G26 and the contacts C25 to C27 form the Nch transistor YN. In other words, the Nch transistors YT, YN have two times the channel width of the Nch transistors PCT, PCN and equalizer circuit EQ.

From the above, it can be understood that the sense amplifier section SA20 includes the precharge section 1023 and Y switch section 1024 shown in FIG. 1. The sense amplifier section SA21 has the same configuration as the sense amplifier section SA20 except that the former is formed over the n-type diffusion layer NW2 and that the Y switch control signal YSW1 is applied to the former.

When gates having the same gate length are disposed at the same pitch, the above-described configuration makes it possible to implement the precharge section and Y switch section of the sense amplifier sections in a minimum area, as is the case with the first embodiment. Further, the above-described configuration makes it possible to increase the gate width of the Nch transistor in the Y switch section. Therefore, the drive capability of the Y switch section can be increased.

Third Embodiment

Figure 5A:
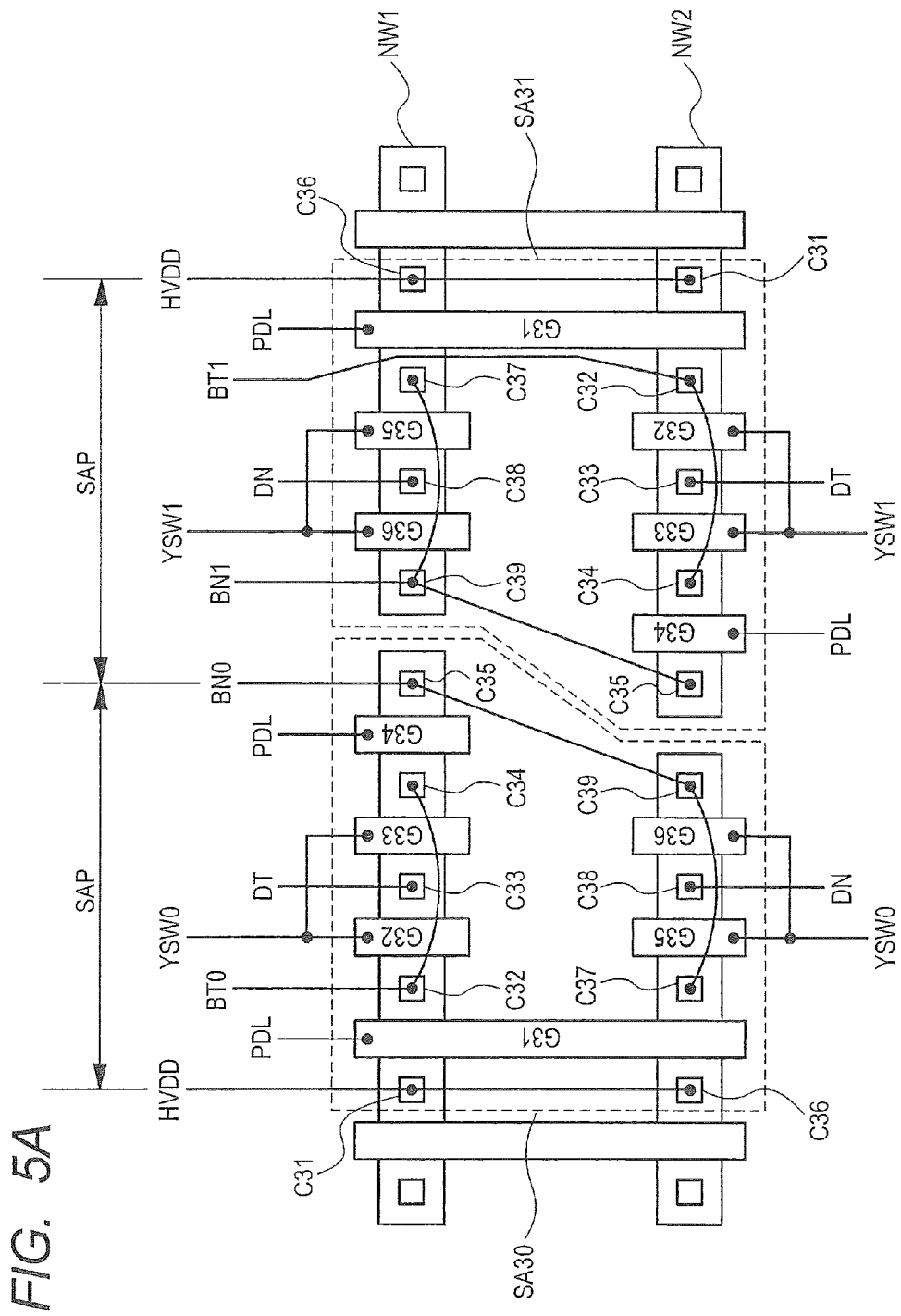
FIG. 5A is a schematic layout diagram illustrating the configuration of essential parts of the sense amplifier section according to a third embodiment.

Next, the semiconductor memory device according to a third embodiment of the present invention will be described. FIG. 5A is a schematic layout diagram illustrating the configuration of essential parts of the sense amplifier section according to the third embodiment. FIG. 5A shows an example in which two sense amplifier sections SA30, SA31 are parallelly disposed. As is the case with the first embodiment, the present embodiment will be described with attention paid to the precharge section and Y switch section of the sense amplifier sections SA30, SA31. For the sake of brevity, FIG. 5A shows n-type diffusion layers only and depicts only an Nch transistor that uses the n-type diffusion layers as a source and a drain.

The sense amplifier sections SA30, SA31 are formed over the n-type diffusion layers NW1, NW2. The bit lines BT0, BT1 each correspond to the bit line BT in FIG. 1. The bit lines BN0, BN1 each correspond to the bit line BN in FIG. 1. The Y switch control signals YSW0, YSW1 each correspond to the Y switch control signal YSW in FIG. 1. The configuration of the sense amplifier section SA30 will be described below as a representative.

The sense amplifier section SA30 includes gates G31 to G36 and contacts C31 to C39. The contacts C31 to C35 are sequentially formed over the n-type diffusion layer NW1 in alignment with each other. The contacts C36 to C39 are sequentially formed over the n-type diffusion layer NW2 in alignment with each other and respectively positioned opposite the contacts C31 to C34.

The gate G31 is positioned between the contacts C31, C32 and formed in a region where the n-type diffusion layer NW1 is not formed. The gate G31 is also positioned between the contacts C36, C37 and formed in a region where the n-type diffusion layer NW2 is not formed. In other words, the gate G31 is formed as a gate that runs across two regions, one region being a region where the n-type diffusion layer NW1 is disposed, the other region being a region where the n-type diffusion layer NW2 is disposed. The gates G32 to G34 are respectively positioned between the contacts C32 to C34 and the contacts C33 to C35 and formed in a region where the n-type diffusion layer NW1 is not formed. The gates G35, G36 are respectively positioned between the contacts C37, C38 and the contacts C38, C39 and formed in a region where the n-type diffusion layer NW2 is not formed.

Figure 5B:
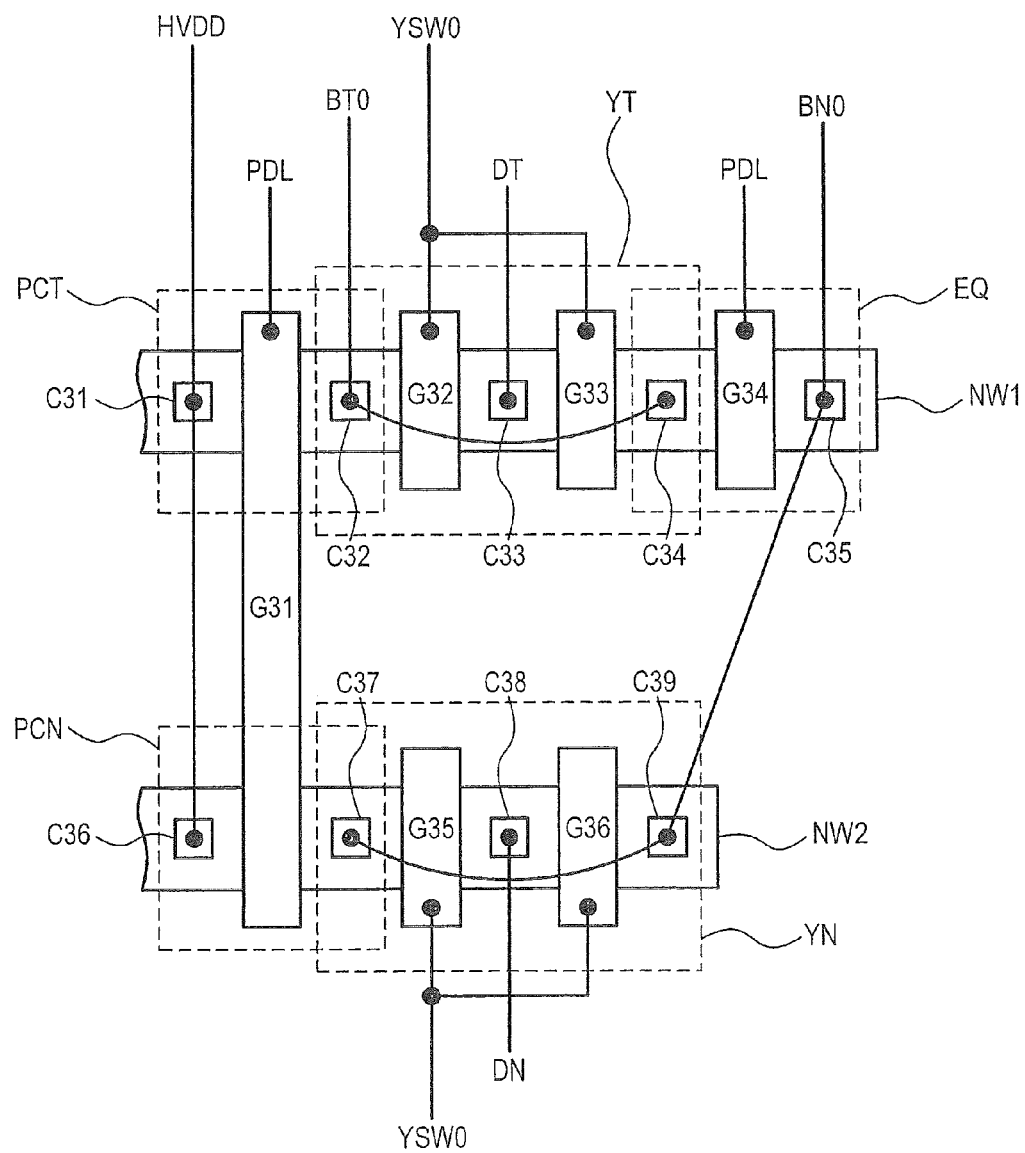
FIG. 5B is a layout diagram illustrating the transistor arrangement of a sense amplifier section SA30.

FIG. 5B is a layout diagram illustrating the transistor arrangement of the sense amplifier section SA30. The contacts C31, C36 are coupled to the power supply HVDD (½ VDD). The contacts C32, C34 are coupled to the bit line BT0. The contacts C35, C37, C39 are coupled to the bit line BN0. The contact C33 is coupled to the bus line DT. The contact C38 is coupled to the bus line DN. The precharge control signal PDL is applied to the gates G31, G34. The Y switch control signal YSW0 is applied to the gates G32, G33, G35, G36.

The gate G31 and the contacts C31, C32 form the Nch transistor PCT. The gate G31 and the contacts C36, C37 form the Nch transistor PCN. The gate G34 and the contacts C34, C35 form the equalizer circuit EQ. The gates G32, G33 and the contacts C32 to C34 form the Nch transistor YT. The gates G35, G36 and the contacts C37 to C39 form the Nch transistor YN. In other words, the Nch transistors YT, YN have two times the channel width of the Nch transistors PCT, PCN and equalizer circuit EQ.

From the above, it can be understood that the sense amplifier section SA30 includes the precharge section 1023 and Y switch section 1024 shown in FIG. 1. The sense amplifier section SA31 is configured by inverting the sense amplifier section SA30 upside down and interchanging the n-type diffusion layers NW1, NW2. Further, the Y switch control signal YSW1 is applied to the sense amplifier section SA31 instead of the Y switch control signal YSW0.

When gates having the same gate length are disposed at the same pitch, the above-described configuration makes it possible to implement the precharge section and Y switch section of the sense amplifier sections in a minimum area, as is the case with the second embodiment. Further, the above-described configuration makes it possible to increase the gate width of the Nch transistor in the Y switch section. Therefore, the drive capability of the Y switch section can be increased, as is the case with the second embodiment. Furthermore, in contrast to the second embodiment, the above-described configuration does not require a spot at which bit lines intersect (a spot at which the bit lines BN0, BT1 in FIG. 4A intersect). This makes it possible to prevent wires coupled to the bit lines from being entangled, thereby making a more flexible design.

Fourth Embodiment

Next, the semiconductor memory device according to a fourth embodiment of the present invention will be described.

Figure 6A:
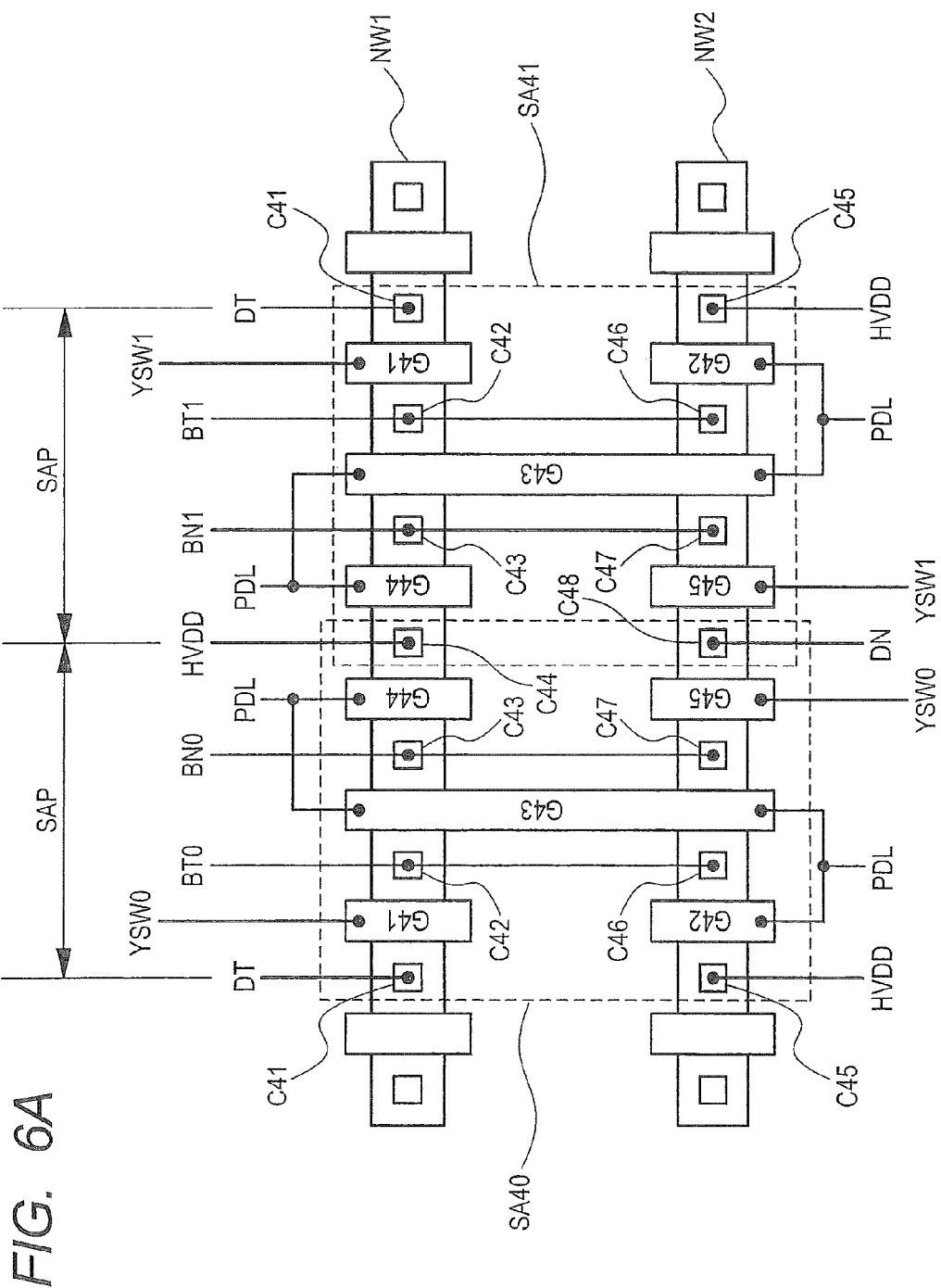
FIG. 6A is a schematic layout diagram illustrating the configuration of essential parts of the sense amplifier section according to a fourth embodiment.

FIG. 6A is a schematic layout diagram illustrating the configuration of essential parts of the sense amplifier section according to the fourth embodiment. FIG. 6A shows an example in which two sense amplifier sections SA40, SA41 are parallelly disposed. As is the case with the first embodiment, the present embodiment will be described with attention paid to the precharge section and Y switch section of the sense amplifier sections SA40, SA41. For the sake of brevity, FIG. 6A shows n-type diffusion layers only and depicts only an Nch transistor that uses the n-type diffusion layers as a source and a drain. The sense amplifier section SA40 is obtained by changing the transistor arrangement of the sense amplifier section SA10 according to the first embodiment.

The sense amplifier sections SA40, SA41 are formed over the n-type diffusion layers NW1, NW2. The bit lines BT0, BT1 each correspond to the bit line BT in FIG. 1. The bit lines BN0, BN1 each correspond to the bit line BN in FIG. 1. The Y switch control signals YSW0, YSW1 each correspond to the Y switch control signal YSW in FIG. 1. The configuration of the sense amplifier section SA40 will be described below as a representative.

The sense amplifier section SA40 includes gates G41 to G45 and contacts C41 to C48. The gate G43 is formed across two regions, one region being a region where the n-type diffusion layer NW1 is disposed, the other region being a region where the n-type diffusion layer NW2 is disposed. The gate G41 is positioned to the left of the gate G43 and formed in a region where the n-type diffusion layer NW1 is not formed. The gate G42 is positioned to the left of the gate G43 and formed in a region where the n-type diffusion layer NW2 is not formed. The gate G44 is positioned to the right of the gate G43 and formed in a region where the n-type diffusion layer NW1 is not formed. The gate G45 is positioned to the right of the gate G43 and formed in a region where the n-type diffusion layer NW2 is not formed.

The contact C41 is formed over the n-type diffusion layer NW1 that is positioned to the left of the gate G41. The contact C42 is formed over the n-type diffusion layer NW1 that is positioned between the gate G41 and the gate G43. The contact C43 is formed over the n-type diffusion layer NW1 that is positioned between the gate G43 and the gate G44. The contact C44 is formed over the n-type diffusion layer NW1 that is positioned to the right of the gate G44. The contact C45 is formed over the n-type diffusion layer NW2 that is positioned to the left of the gate G42. The contact C46 is formed over the n-type diffusion layer NW2 that is positioned between the gate G42 and the gate G43. The contact C47 is formed over the n-type diffusion layer NW2 that is positioned between the gate G43 and the gate G45. The contact C48 is formed over the n-type diffusion layer NW2 that is positioned to the right of the gate G45.

The contacts C44, C45 are coupled to the power supply HVDD (½ VDD). The contacts C42, C46 are coupled to the bit line BT0. The contacts C43, C47 are coupled to the bit line BN0. The contact C41 is coupled to the bus line DT. The contact C48 is coupled to the bus line DN. The precharge control signal PDL is applied to the gates G42 to G44. The Y switch control signal YSW0 is applied to the gates G41, G45.

Figure 6B:
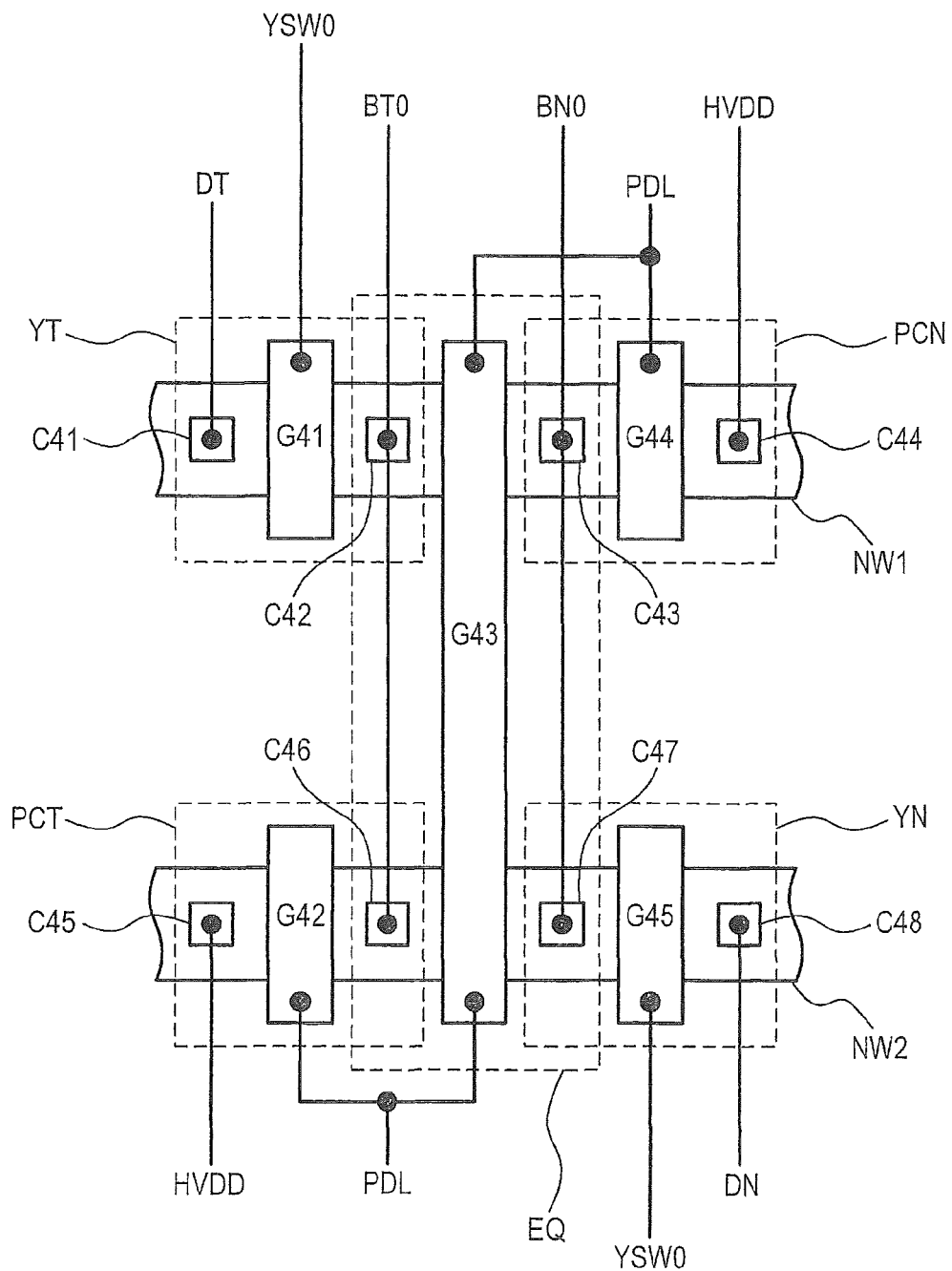
FIG. 6B is a layout diagram illustrating the transistor arrangement of a sense amplifier section SA40.

FIG. 6B is a layout diagram illustrating the transistor arrangement of the sense amplifier section SA40. The gate G44 and the contacts C43, C44 form the Nch transistor PCN. The gate G42 and the contacts C45, C46 form the Nch transistor PCT. The gate G43 and the contacts C42, C43, C46, C47 form the equalizer circuit EQ. In other words, the equalizer circuit EQ is configured as an Nch transistor having a greater channel width than the Nch transistors PCT, PCN. The gate G41 and the contacts C41, C42 form the Nch transistor YT. The gate G45 and the contacts C47, C48 form the Nch transistor YN.

In other words, the sense amplifier section SA40 is configured by interchanging the positions of the Nch transistor PCT and Nch transistor YT of the sense amplifier section SA10.

From the above, it can be understood that the sense amplifier section SA40 includes the precharge section 1023 and Y switch section 1024 shown in FIG. 1. The sense amplifier section SA41 is configured by inverting the sense amplifier section SA40 left to right.

Further, the sense amplifier sections SA40, SA41 share the contacts C44, C48. Therefore, the sense amplifier sections can be densely disposed in a small area, as is the case with the first embodiment. Moreover, signal acquisition can be accomplished with ease when the bus line DT is disposed in a high place while the bus line DN is disposed in a low place.

When gates having the same gate length are disposed at the same pitch, the above-described configuration makes it possible to implement the precharge section and Y switch section of the sense amplifier sections in a minimum area, as is the case with the first embodiment. Further, the above-described configuration makes it possible to increase the gate width of the equalizer circuit EQ. Therefore, the potentials of the paired bit lines can be rapidly equalized at the time of equalization.

Fifth Embodiment

Next, the semiconductor memory device according to a fifth embodiment of the present invention will be described. FIG. 7A is a schematic layout diagram illustrating the configuration of essential parts of the sense amplifier section according to the fifth embodiment. FIG. 7A shows an example in which three sense amplifier sections SA50 to SA52 are parallelly disposed. As is the case with the first embodiment, the present embodiment will be described with attention paid to the precharge section and Y switch section of the sense amplifier sections SA50 to SA52. For the sake of brevity, FIG. 7A shows n-type diffusion layers only and depicts only an Nch transistor that uses the n-type diffusion layers as a source and a drain.

The sense amplifier sections SA50 to SA52 are formed over the n-type diffusion layers NW1, NW2. The bit lines BT0 to BT2 each correspond to the bit line BT in FIG. 1. The bit lines BN0 to BN2 each correspond to the bit line BN in FIG. 1. The Y switch control signals YSW0 to YSW2 each correspond to the Y switch control signal YSW in FIG. 1. The configuration of the sense amplifier section SA50 will be described below as a representative.

The sense amplifier section SA50 includes gates G51 to G53 and contacts C51 to C58. The gate G52 is formed across two regions, one region being a region where the n-type diffusion layer NW1 is disposed, the other region being a region where the n-type diffusion layer NW2 is disposed. The gate G51 is positioned to the left of the gate G52 and formed across two regions, one region being a region where the n-type diffusion layer NW1 is disposed, the other region being a region where the n-type diffusion layer NW2 is disposed. The gate G53 is positioned to the right of the gate G52 and formed across two regions, one region being a region where the n-type diffusion layer NW1 is disposed, the other region being a region where the n-type diffusion layer NW2 is disposed.

The contact C51 is formed over the n-type diffusion layer NW1 that is positioned to the left of the gate G51. The contact C52 is formed over the n-type diffusion layer NW1 that is positioned between the gate G51 and the gate G52. The contact C53 is formed over the n-type diffusion layer NW1 that is positioned between the gate G52 and the gate G53. The contact C54 is formed over the n-type diffusion layer NW1 that is positioned to the right of the gate G53. The contact C55 is formed over the n-type diffusion layer NW2 that is positioned to the left of the gate G51. The contact C56 is formed over the n-type diffusion layer NW2 that is positioned between the gate G51 and the gate G52. The contact C57 is formed over the n-type diffusion layer NW2 that is positioned between the gate G52 and the gate G53. The contact C58 is formed over the n-type diffusion layer NW2 that is positioned to the right of the gate G53.

The contacts C54, C58 are coupled to the power supply HVDD (½ VDD). The contacts C52, C57 are coupled to the bit line BT0. The contacts C53, C56 are coupled to the bit line BN0. The contact C51 is coupled to the bus line DT. The contact C55 is coupled to the bus line DN. The precharge control signal PDL is applied to the gates G52, G53. The Y switch control signal YSW0 is applied to the gate G51.

Figure 7B:
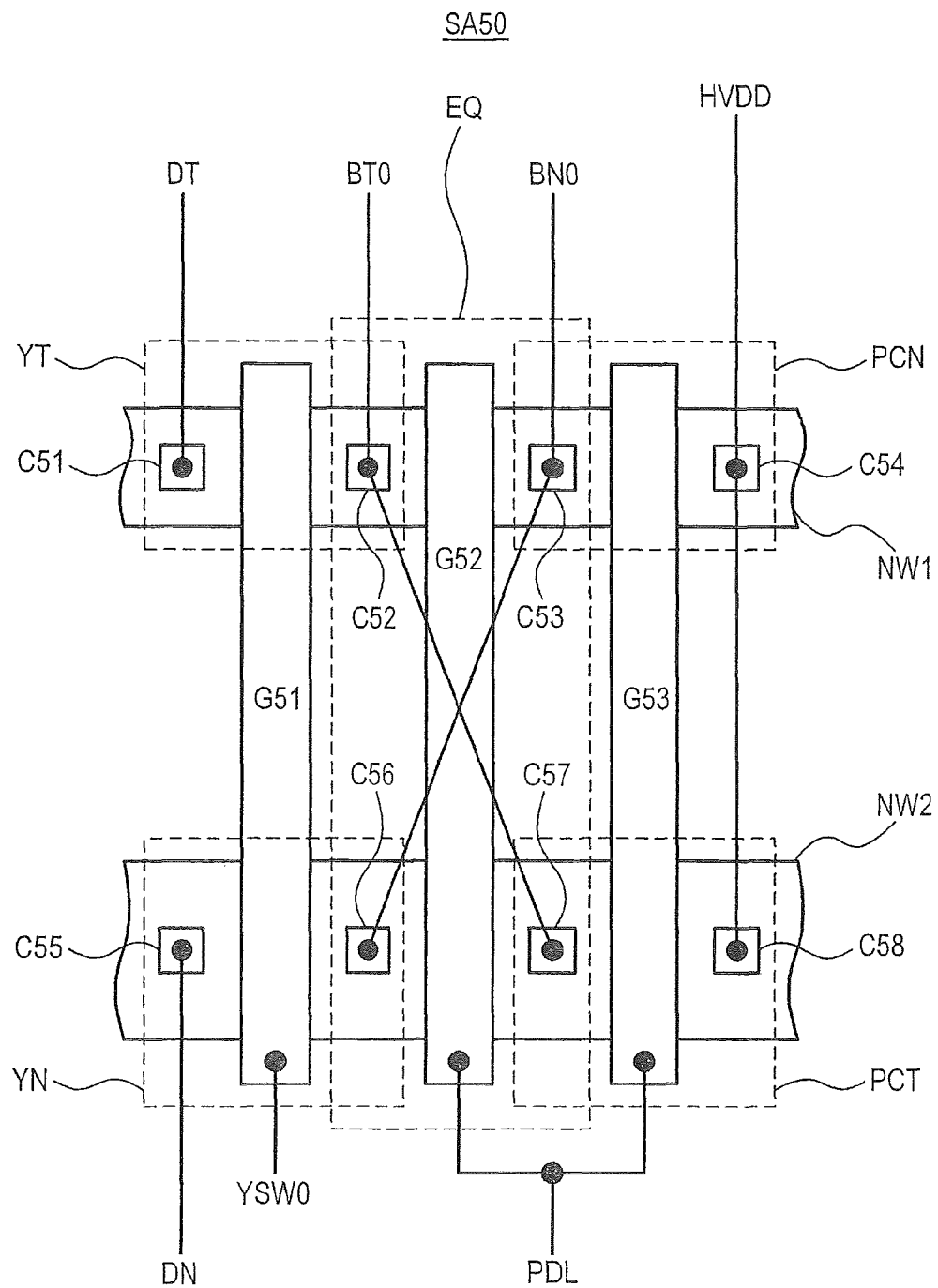
FIG. 7B is a layout diagram illustrating the transistor arrangement of a sense amplifier section SA50.

FIG. 7B is a layout diagram illustrating the transistor arrangement of the sense amplifier section SA50. The gate G53 and the contacts C57, C58 form the Nch transistor PCT. The gate G53 and the contacts C53, C54 form the Nch transistor PCN. The gate G52 and the contacts C52, C53, C56, C57 form the equalizer circuit EQ. In other words, the equalizer circuit EQ is configured as an Nch transistor having a greater channel width than the Nch transistors PCT, PCN. The gate G51 and the contacts C51, C52 form the Nch transistor YT. The gate G51 and the contacts C55, C56 form the Nch transistor YN.

From the above, it can be understood that the sense amplifier section SA50 includes the precharge section 1023 and Y switch section 1024 shown in FIG. 1. The sense amplifier section SA51 is configured by inverting the sense amplifier section SA50 left to right. The sense amplifier section SA52 has the same configuration as the sense amplifier section SA50.

Further, the sense amplifier sections SA50, SA51 share the contacts C54, C58. The sense amplifier sections SA51, SA52 share the contacts C51, C55. Therefore, the sense amplifier sections can be densely disposed in a small area, as is the case with the first embodiment.

When gates having the same gate length are disposed at the same pitch, the above-described configuration makes it possible to implement the precharge section and Y switch section of the sense amplifier sections in a minimum area, as is the case with the first embodiment. Further, the above-described configuration makes it possible to increase the gate width of the equalizer circuit EQ. Therefore, the potentials of the paired bit lines can be rapidly equalized at the time of equalization. Furthermore, as the shapes of the gates can be uniformed, the gates can be collectively prepared. Moreover, as the gates on the upper and lower stages need not be separated from each other, the distance between the n-type diffusion layer NW1 and the n-type diffusion layer NW2 can be decreased.

Sixth Embodiment

Figure 8A:
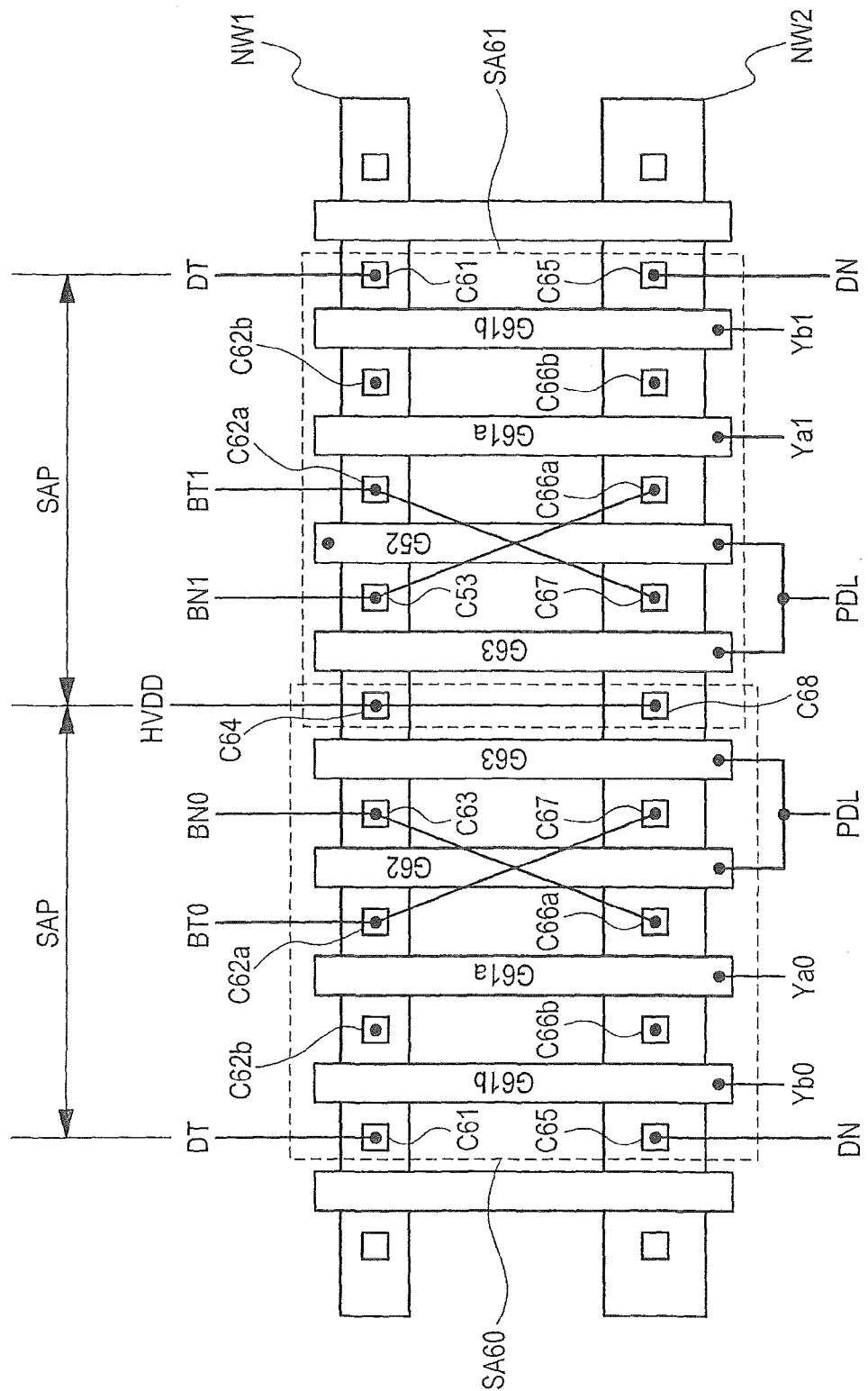
FIG. 8A is a schematic layout diagram illustrating the configuration of essential parts of the sense amplifier section according to a sixth embodiment.

Next, the semiconductor memory device according to a sixth embodiment of the present invention will be described. FIG. 8A is a schematic layout diagram illustrating the configuration of essential parts of the sense amplifier section according to the sixth embodiment. FIG. 8A shows an example in which two sense amplifier sections SA60, SA61 are parallelly disposed. As is the case with the first embodiment, the present embodiment will be described with attention paid to the precharge section and Y switch section of the sense amplifier sections SA60, SA61. For the sake of brevity, FIG. 8A shows n-type diffusion layers only and depicts only an Nch transistor that uses the n-type diffusion layers as a source and a drain. The sense amplifier sections SA60, SA61 are obtained by changing the Y switch section configuration of the sense amplifier sections SA50, SA51 according to the fifth embodiment.

The bit lines BT0, BT1 each correspond to the bit line BT in FIG. 1. The bit lines BN0, BN1 each correspond to the bit line BN in FIG. 1. Y switch control signals Ya0, Ya1, Yb0, Yb1 each correspond to the Y switch control signal YSW in FIG. 1. In the present embodiment, the Y switch control signals Ya0, Ya1 are referred to also as the second control signals, and the Y switch control signals Yb0, Yb1 are referred to also as the third control signals.

In the sense amplifier section SA60, the gate G51 of the sense amplifier section SA50 is changed to two gates G61a, G61b. Further, in the sense amplifier section SA60, the contact C52 of the sense amplifier section SA50 is changed to two contacts C62a, C62b, and the contact C56 is changed to two contacts C66a, C66b. The gates G62, G63, and contacts C61, C63 to C65, C67, C68 of the sense amplifier section SA60 respectively correspond to the gates G52, G53 and contacts C51, C53 to C55, C57, C58 of the sense amplifier section SA50.

Figure 8B:
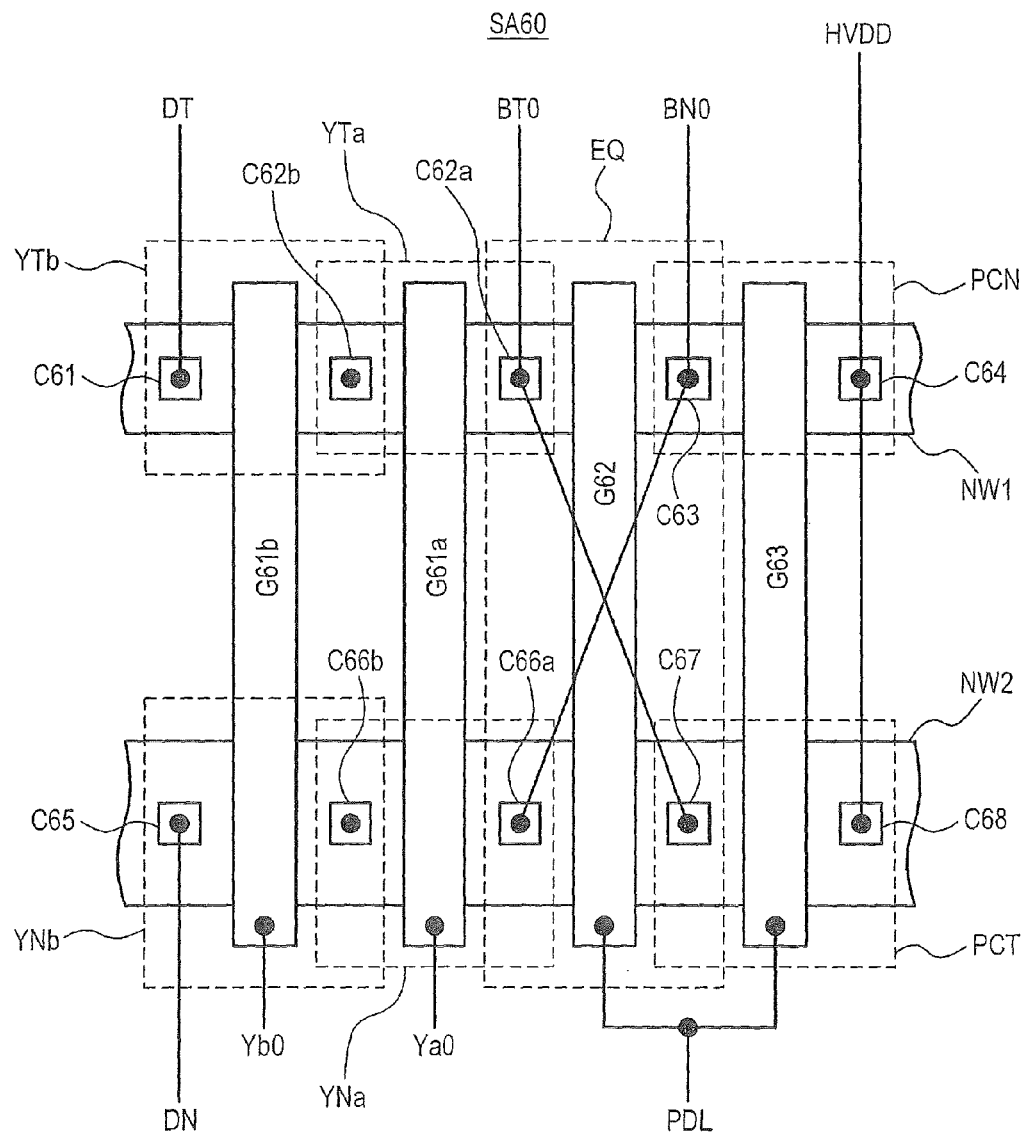
FIG. 8B is a layout diagram illustrating the transistor arrangement of a sense amplifier section SA60.

FIG. 8B is a layout diagram illustrating the transistor arrangement of the sense amplifier section SA60. In the sense amplifier section SA60, the gate G61a and the contacts C62a, C62b form an Nch transistor YTa. The gate G61b and the contacts C61, C62b form an Nch transistor YTb. The gate G61a and the contacts C66a, C66b form an Nch transistor YNa. The gate G61b and the contacts C65, C66b form an Nch transistor YNb. In the present embodiment, the Nch transistor YTb is referred to also as the fifth transistor, and the Nch transistor YNb is referred to also as the sixth transistor.

In other words, the sense amplifier section SA60 includes two Nch transistors having the same configuration as the Nch transistor YT of the sense amplifier section SA50, namely, the Nch transistors YTa, YTb. Further, the sense amplifier section SA60 includes two Nch transistors having the same configuration as the Nch transistor YN of the sense amplifier section SA50, namely, the Nch transistors YNa, YNb.

Figure 8C:
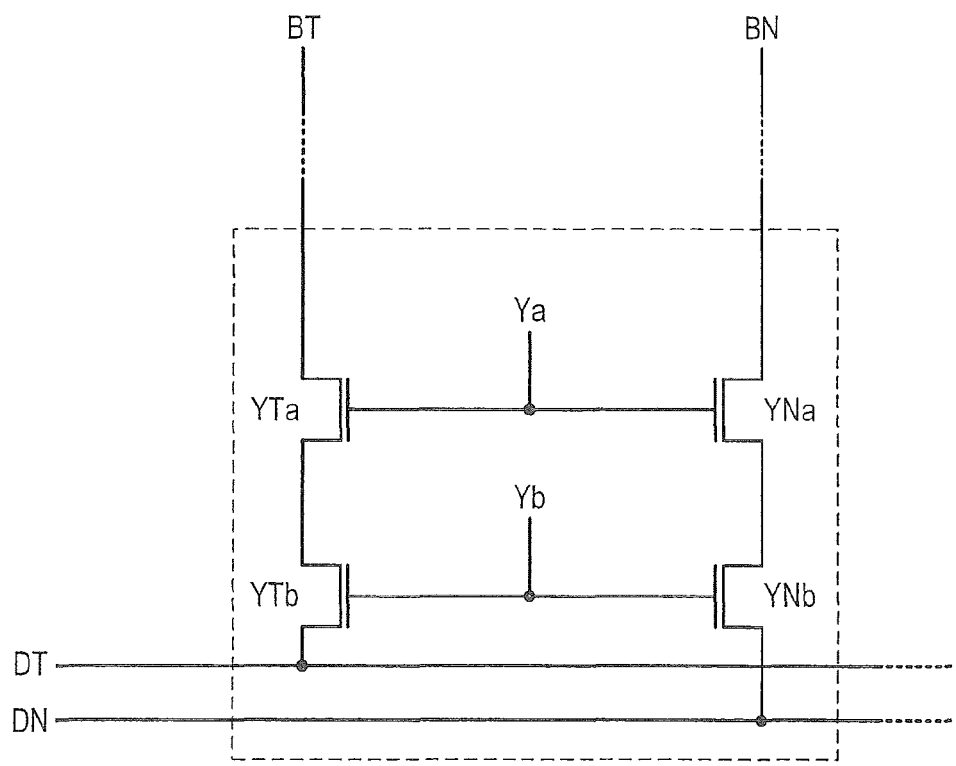
FIG. 8C is a circuit diagram illustrating the configuration of a Y switch section 1024*a* having Nch transistors YTa, YTb, YNa, YNb.

FIG. 8C is a circuit diagram illustrating the configuration of a Y switch section 1024a having the Nch transistors YTa, YTb, YNa, YNb. Y switch control signals Ya, Yb each correspond to the Y switch control signal YSW in FIG. 1. As shown in FIG. 8C, the Nch transistors YTa, YTb are coupled in parallel between the bit line BT and the bit line BN. The Nch transistors YNa, YNb are coupled in parallel between the bit line BT and the bit line BN. Hence, the configuration of the sense amplifier section SA60 makes it possible to increase the substantial channel width of the Y switch Nch transistors.

Consequently, when gates having the same gate length are disposed at the same pitch, the above-described configuration makes it possible to implement the precharge section and Y switch section of the sense amplifier sections in a minimum area, as is the case with the second embodiment. Further, the above-described configuration makes it possible to increase the Nch transistor gate width of the Y switch section. Therefore, the drive capability of the Y switch section can be increased, as is the case with the second embodiment. Furthermore, in contrast to the second embodiment, the above-described configuration does not require a spot at which bit lines intersect (a spot at which the bit lines BN0, BT1 in FIG. 4A intersect), as is the case with the fifth embodiment. This makes it possible to prevent wires coupled to the bit lines from being entangled, thereby making a more flexible design.

Seventh Embodiment

Figure 9A:
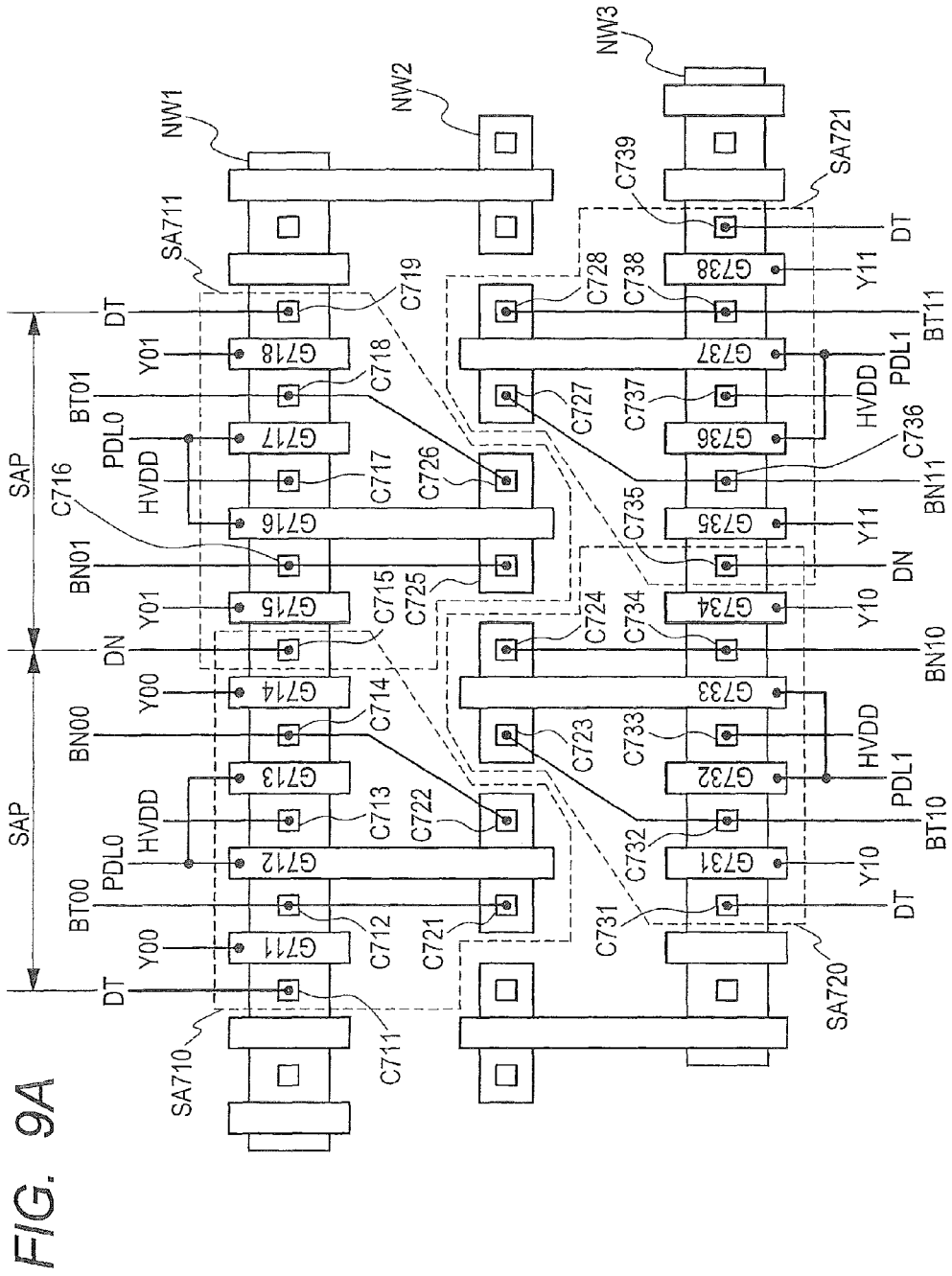
FIG. 9A is a schematic layout diagram illustrating the configuration of essential parts of the sense amplifier section according to a seventh embodiment.

Next, the semiconductor memory device according to a seventh embodiment of the present invention will be described. FIG. 9A is a schematic layout diagram illustrating the configuration of essential parts of the sense amplifier section according to the seventh embodiment. FIG. 9A shows an example in which four sense amplifier sections SA710, SA711, SA720, SA721 are disposed. As is the case with the first embodiment, the present embodiment will be described with attention paid to the precharge section and Y switch section of the sense amplifier sections SA710, SA711, SA720, SA721. For the sake of brevity, FIG. 9A shows n-type diffusion layers only and depicts only an Nch transistor that uses the n-type diffusion layers as a source and a drain.

The sense amplifier sections SA710, SA711 are formed over n-type diffusion layers NW1, NW2. The sense amplifier sections SA720, SA721 are formed over n-type diffusion layers NW2, NW3. Bit lines BT00, BT01, BT10, BT11 each correspond to the bit line BT in FIG. 1. The bit lines BN00, BN01, BN10, BN11 each correspond to the bit line BN in FIG. 1. Y switch control signals Y00, Y01, Y10, Y11 each correspond to the Y switch control signal YSW in FIG. 1. The n-type diffusion layers NW1-NW3 are disposed in the same direction and aligned with each other. Precharge control signals PDL0, PDL1 correspond to the precharge control signal PDL in FIG. 1. In the present embodiment, the precharge control signal PDL0 is referred to as the first control signal, and the precharge control signal PDL1 is referred to as the fourth control signal. Further, in the present embodiment, the Y switch control signals Y00, Y01 are referred to as the second control signals, and the Y switch control signals Y10, Y11 are referred to as the fifth control signals. In the present embodiment, the bit lines BT00, BT01 are referred to as the first bit lines, the bit lines BN00, BN01 are referred to as the second bit lines, the bit lines BT10, BT11 are referred to as the third bit lines, and the bit lines BN10, BN11 are referred to as the fourth bit lines.

The sense amplifier section SA710 includes gates G711 to G714 and contacts C711 to C715, C721, C722. The gate G712 is formed across two regions, one region being a region where the n-type diffusion layer NW1 is disposed, the other region being a region where the n-type diffusion layer NW2 is disposed. The gate G711 is positioned to the left of the gate G712 and formed in a region where the n-type diffusion layer NW1 is not formed. The gate G713 is positioned to the right of the gate G712 and formed in a region where the n-type diffusion layer NW1 is not formed. The gate G714 is positioned to the right of the gate G713 and formed in a region where the n-type diffusion layer NW1 is not formed.

The contact C711 is formed over the n-type diffusion layer NW1 that is positioned to the left of the gate G711. The contact C712 is formed over the n-type diffusion layer NW1 that is positioned between the gate G711 and the gate G712. The contact C713 is formed over the n-type diffusion layer NW1 that is positioned between the gate G712 and the gate G713. The contact C714 is formed over the n-type diffusion layer NW1 that is positioned between the gate G713 and the gate G714. The contact C715 is formed over the n-type diffusion layer NW1 that is positioned to the right of the gate G714. The contact C721 is formed over the n-type diffusion layer NW2 that is positioned to the left of the gate G712. The contact C722 is formed over the n-type diffusion layer NW2 that is positioned to the right of the gate G712.

The contact C713 is coupled to the power supply HVDD (½VDD). The contacts C712, C721 are coupled to the bit line BT00. The contacts C714, C722 are coupled to the bit line BN00. The contact C711 is coupled to the bus line DT. The contact C715 is coupled to the bus line DN. The precharge control signal PDL0 is applied to the gates G712, G713. The Y switch control signal Y00 is applied to the gates G711, G714.

Figure 9B:
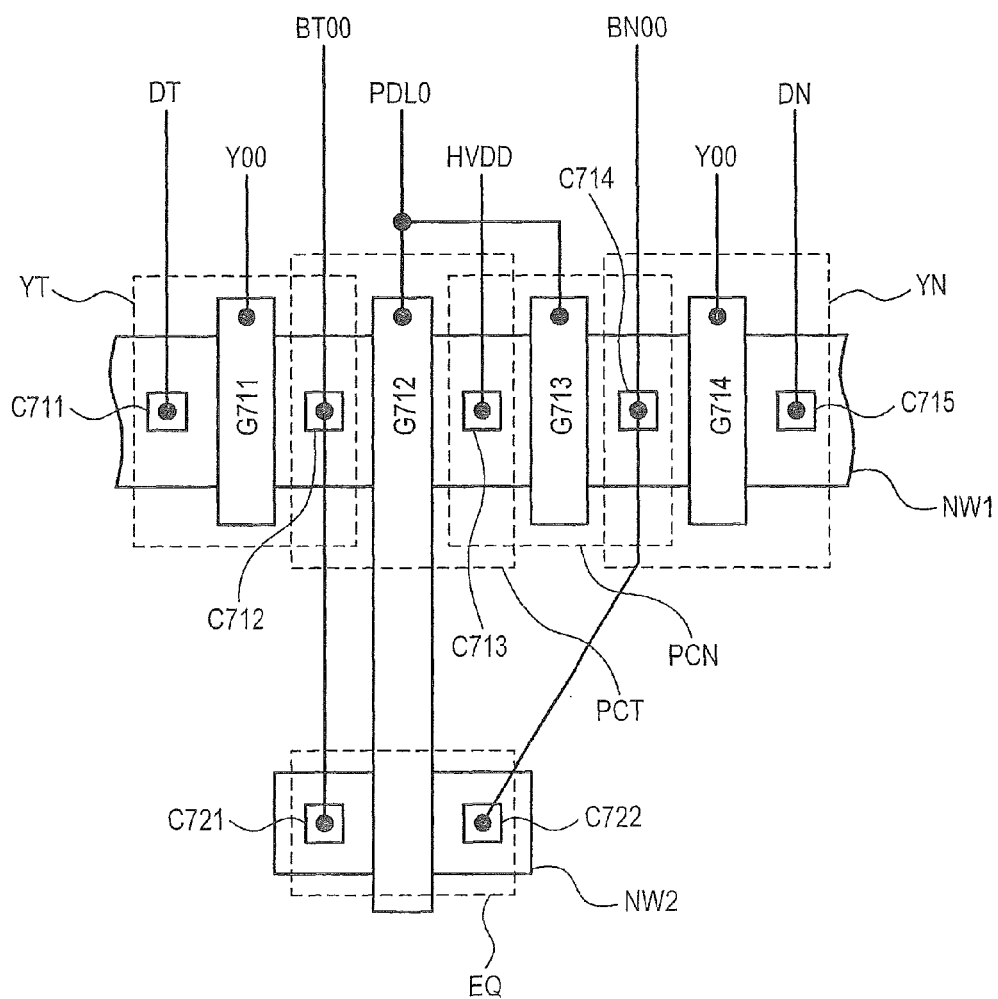
FIG. 9B is a layout diagram illustrating the transistor arrangement of a sense amplifier section SA711.

FIG. 9B is a layout diagram illustrating the transistor arrangement of the sense amplifier section SA711. The gate G712 and the contacts C712, C713 form the Nch transistor PCT. The gate G713 and the contacts C713, C714 form the Nch transistor PCN. The gate G712 and the contacts C721, C722 form the equalizer circuit EQ. The gate G711 and the contacts C711, C712 form the Nch transistor YT. The gate G714 and the contacts C714, C715 form the Nch transistor YN.

The sense amplifier section SA711 includes gates G715 to G718 and contacts C715 to C719, C725, C726. The sense amplifier section SA711 has the same configuration as the sense amplifier section SA710. However, the gates G715 to G718 and the contacts C715 to C719, C725, C726 respectively correspond to the gates G711 to G714 and contacts C711 to C715, C721, C722 of the sense amplifier section SA710. The sense amplifier sections SA710, SA711 share the contact C715.

The sense amplifier sections SA720, SA721 respectively have the same configuration as the sense amplifier sections SA711, SA710. In the sense amplifier sections SA720, SA721, the n-type diffusion layer NW3 corresponds to the n-type diffusion layer NW1. Gates G731 to G738 respectively correspond to the gates G718 to G711. Contacts C731 to C739, C723, C724, C727, C728, which are formed over the n-type diffusion layer NW2, respectively correspond to the contacts C719 to C711, C726, C725, C722, C721. The sense amplifier sections SA720, SA721 share the contact C735.

In other words, it can be understood that the sense amplifier sections SA720, SA721 are obtained when the sense amplifier sections SA711, SA710 shown in FIG. 9A are inverted upside down and left to right (or rotated 180°).

When gates having the same gate length are disposed at the same pitch, the above-described configuration makes it possible to implement the precharge section and Y switch section of the sense amplifier sections in a minimum area. Further, the sense amplifier sections can be disposed in a minimum area with respect to the upper and lower paired bit lines from both sides.

As for the sense amplifier sections according to any one of the first to sixth embodiments, four n-type diffusion layers need to be lined up when two vertically arranged sense amplifier sections are to be disposed. However, when the equalizer circuits EQ are alternately disposed by using the n-type diffusion layer NW2, the above-described configuration permits two vertically arranged sense amplifier sections to be disposed as far as three n-type diffusion layers are lined up. Consequently, the above-described configuration makes it possible to efficiently dispose the sense amplifier sections in a small area.

Eighth Embodiment

Figure 10:
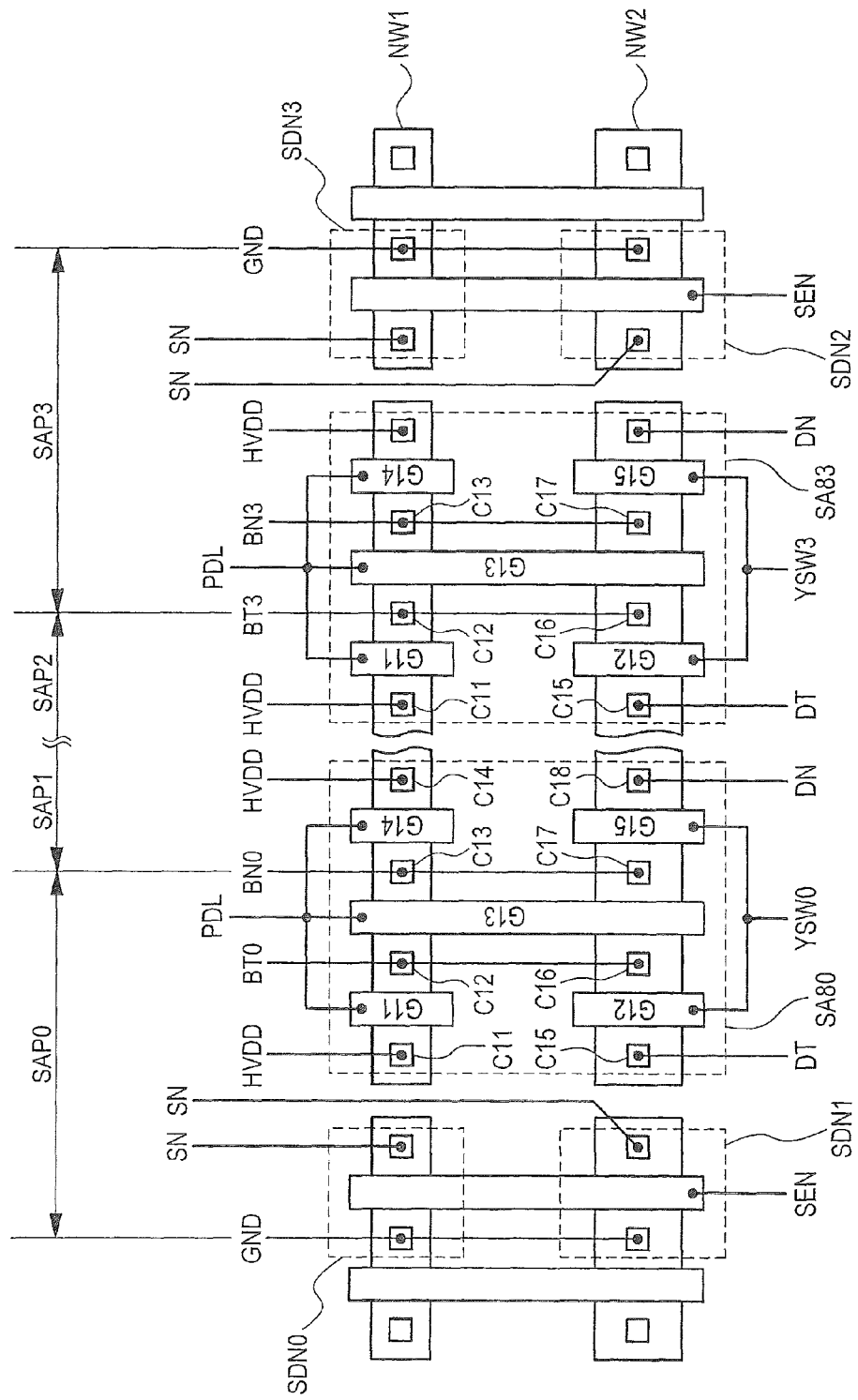
FIG. 10 is a schematic layout diagram illustrating the configuration of essential parts of the sense amplifier section and sense amplifier driver according to an eighth embodiment.

Next, the semiconductor memory device according to an eighth embodiment of the present invention will be described. FIG. 10 is a schematic layout diagram illustrating the configuration of essential parts of the sense amplifier section according to the eighth embodiment. For the sake of brevity, FIG. 10 shows n-type diffusion layers only and depicts only an Nch transistor that uses the n-type diffusion layers as a source and a drain.

The present embodiment includes sense amplifier sections SA80 to SA83, which are parallelly disposed. For the sake of brevity, FIG. 10 shows only the sense amplifier sections SA80, SA83 on both ends. The sense amplifier sections SA80, SA82 have the same configuration as the sense amplifier section SA10 according to the first embodiment. The sense amplifier sections SA81, SA83 have the same configuration as the sense amplifier section SA11 according to the first embodiment.

Bit lines BT0 to BT3 correspond to the bit line BT in FIG. 1 and are respectively coupled to the sense amplifier sections SA80 to SA83. Bit lines BN0 to BN3 correspond to the bit line BN in FIG. 1 and are respectively coupled to the sense amplifier sections SA80 to SA83. Y switch control signals YSW0 to YSW3 correspond to the Y switch control signal YSW in FIG. 1 and are respectively coupled to the sense amplifier sections SA80 to SA83. For the sake of brevity, however, FIG. 10 shows only the bit lines BT0, BT3, the bit lines BN0, BN3, and the Y switch control signals YSW0, YSW3. It should be noted that SAP0 to SAP3 respectively denote sense amplifier pitches for the sense amplifier sections SA80 to SA83.

Nch transistors SDN0, SDN2 for a sense amplifier driver are formed to the left of the sense amplifier section SA80. Nch transistors SDN2, SDN3 for a sense amplifier driver are formed to the left of the sense amplifier section SA83. The Nch transistors SDN0 to SDN3 correspond to the Nch transistor SDN for the sense amplifier driver 1022 shown in FIG. 1. The Nch transistors SDN0 to SDN3 are coupled between the common source line SN and the ground GND so that the sense amplifier control signal SEN is input to the gate. In the present embodiment, the Nch transistors SDN0 to SDN3 are referred to also as the fifth transistors. Further, in the present embodiment, the Pch transistor SDP shown in FIG. 1 is referred to also as the sixth transistor.

The four Nch transistors SDN0 to SDN3 are formed in a region that is occupied by the four sense amplifier pitches SAP0 to SAP3. In other words, the Nch transistors SDN0 to SDN3 are disposed in the margins of the sense amplifier pitches. Consequently, the sense amplifier section and the sense amplifier driver can be repeatedly disposed every four sense amplifier pitches.

Ninth Embodiment

Figure 11A:
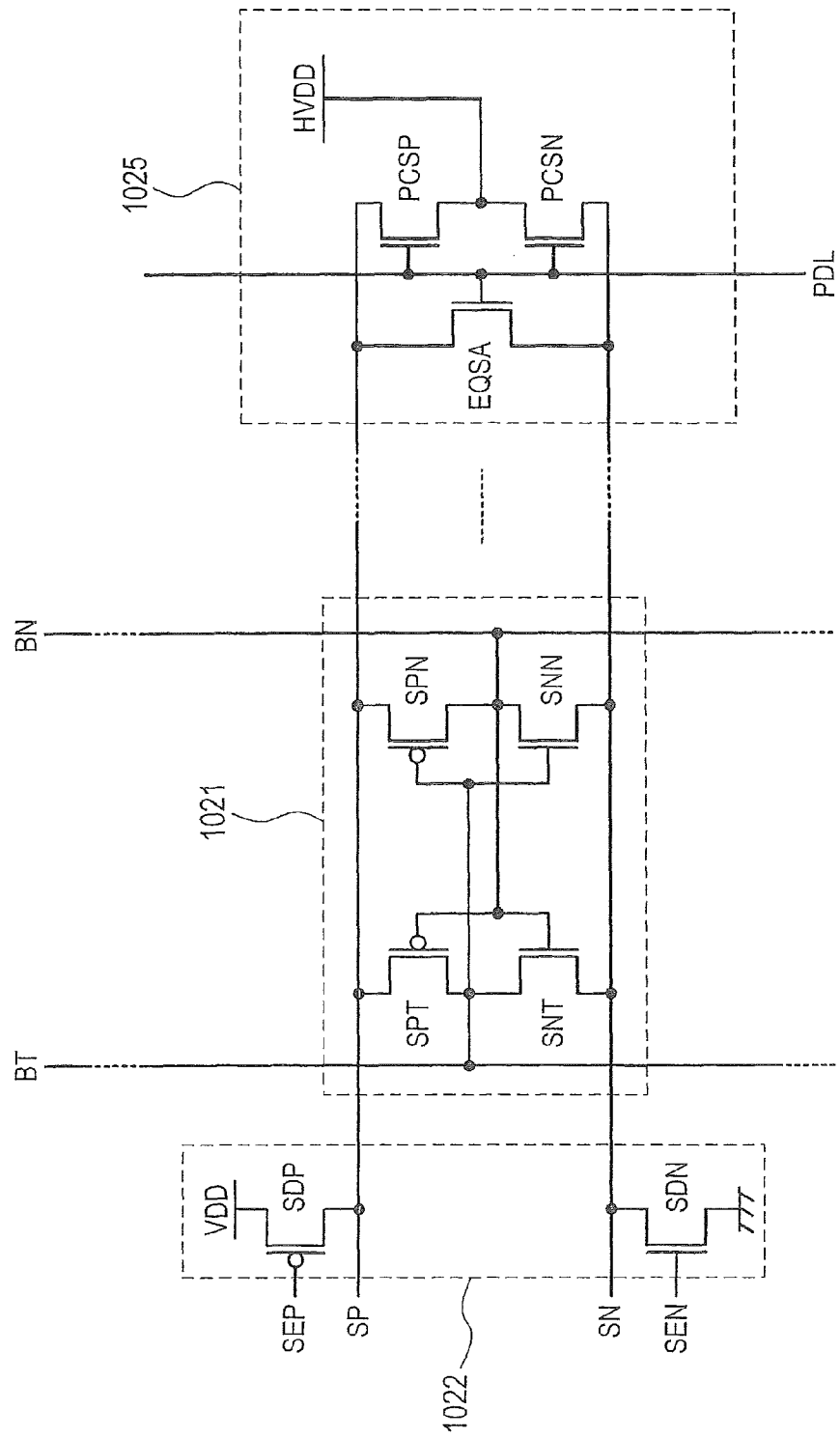
FIG. 11A is a schematic circuit diagram illustrating the coupling relationship between the sense amplifier section, sense amplifier driver, and common source line precharge section of the semiconductor memory device according to a ninth embodiment.

Next, the semiconductor memory device according to a ninth embodiment of the present invention will be described. The semiconductor memory device according to the ninth embodiment includes not only the sense amplifier section and sense amplifier driver, but also a common source line precharge section that precharges the common source lines SP, SN. FIG. 11A is a schematic circuit diagram illustrating the coupling relationship between the sense amplifier section, sense amplifier driver, and common source line precharge section of the semiconductor memory device according to the ninth embodiment. For the sake of brevity, FIG. 11A shows only the sense amplifier driver 1022, the amplifier section 1021, and the common source line precharge section 1025. The sense amplifier driver 1022 and the amplifier section 1021 are the same as shown in FIG. 1 and will not be redundantly described.

The common source line precharge section 1025 includes Nch transistors PCSP, PCSN and an equalizer circuit EQSA. The Nch transistors PCSP, PCSN are elements that precharge the common source lines SP, SN to a voltage of ½ VDD while the sense amplifier section 1002 is inactive. The Nch transistor PCSP is coupled between the common source line SP and the power supply HVDD (½ VDD). The Nch transistor PCSN is coupled between the common source line SN and the power supply HVDD (½ VDD). The equalizer circuit EQSA is an element that rapidly equalizes the potentials of the common source lines SP, SN.

The equalizer circuit EQSA is coupled between the common source lines SP, SN, and configured as an NMOS transfer gate. In other words, the equalizer circuit EQSA functions as a switch that electrically couples or uncouples the common source lines SP, SN.

The precharge control signal PDL is applied to the gates of the Nch transistors PCSP, PCSN and to a control terminal of the equalizer circuit EQSA. Therefore, the Nch transistors PCSP, PCSN and the equalizer circuit EQSA turn on and off in synchronism with each other.

Figure 11B:
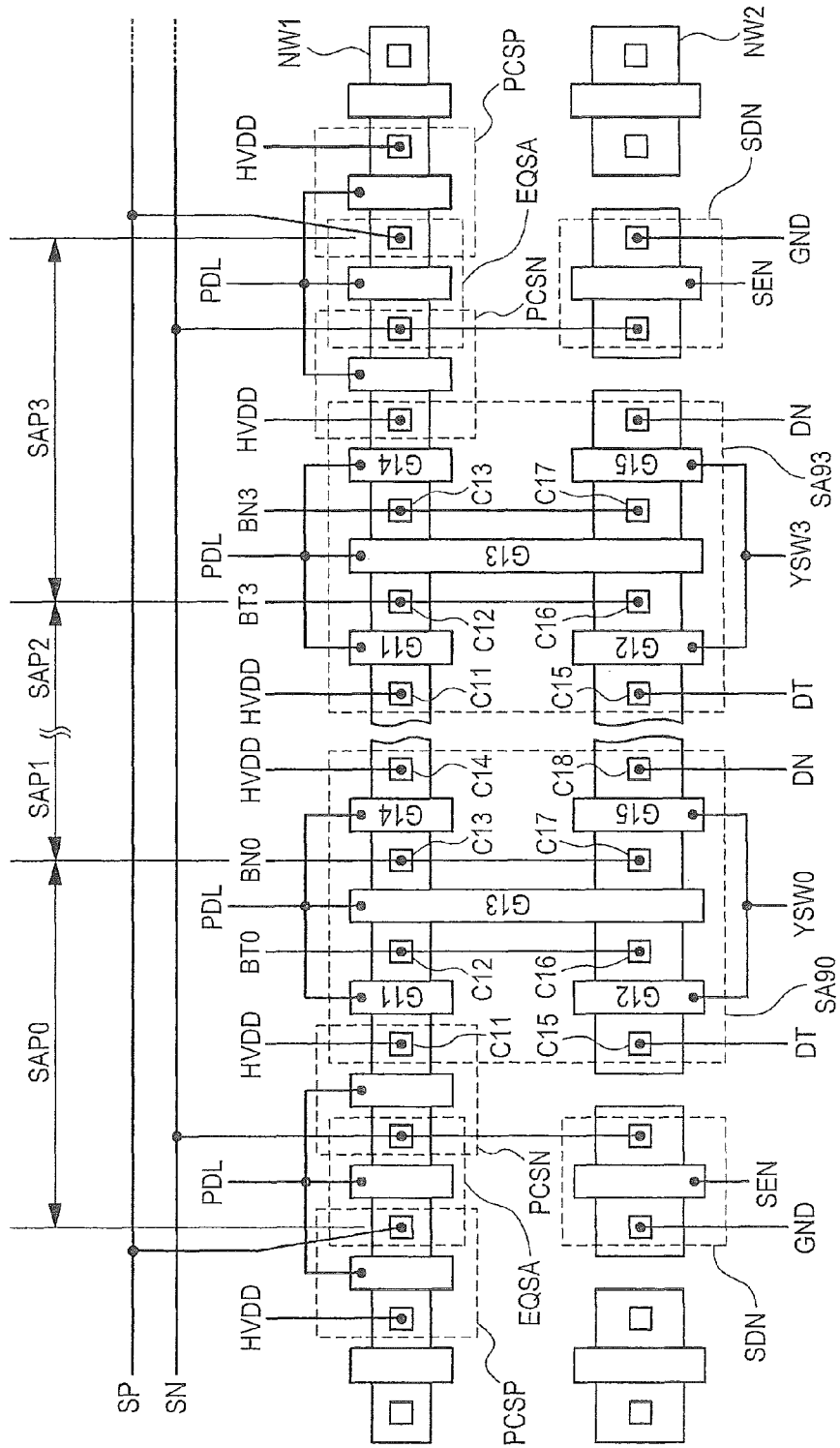
FIG. 11B is a schematic layout diagram illustrating the configuration of essential parts of the sense amplifier section, sense amplifier driver, and common source line precharge section of the semiconductor memory device according to the ninth embodiment.

The layout of the semiconductor memory device according to the ninth embodiment will now be described. FIG. 11B is a schematic layout diagram illustrating the configuration of essential parts of the sense amplifier section, sense amplifier driver, and common source line precharge section according to the ninth embodiment. For the sake of brevity, FIG. 11B shows n-type diffusion layers only and depicts only an Nch transistor that uses the n-type diffusion layers as a source and a drain.

The present embodiment includes sense amplifier sections SA90 to SA93, which are parallelly disposed. For the sake of brevity, FIG. 11B shows only the sense amplifier sections SA90, SA93 on both ends. The sense amplifier sections SA90, SA92 have the same configuration as the sense amplifier section SA10 according to the first embodiment. The sense amplifier sections SA91, SA93 have the same configuration as the sense amplifier section SA11 according to the first embodiment.

The bit lines BT0 to BT3 correspond to the bit line BT in FIG. 1 and are respectively coupled to the sense amplifier sections SA90 to SA93. The bit lines BN0 to BN3 correspond to the bit line BN in FIG. 1 and are respectively coupled to the sense amplifier sections SA90 to SA93. The Y switch control signals YSW0 to YSW3 correspond to the Y switch control signal YSW in FIG. 1 and are respectively coupled to the sense amplifier sections SA90 to SA93. For the sake of brevity, however, FIG. 11B shows only the bit lines BT0, BT3, the bit lines BN0, BN3, and the Y switch control signals YSW0, YSW3. It should be noted that SAP0 to SAP3 respectively denote sense amplifier pitches for the sense amplifier sections SA90 to SA93.

As shown in FIG. 11B, the Nch transistors PCSP, PCSN and equalizer circuit EQSA in the common source line precharge section are formed by using the n-type diffusion layer NW1 positioned to the left of the sense amplifier section SA90. Further, the Nch transistor SDN in the sense amplifier driver is formed by using the n-type diffusion layer NW2 positioned to the left of the sense amplifier section SA90.

The Nch transistors PCSP, PCSN and the equalizer circuit EQSA are formed in a region that is occupied by the pitches SAP0 to SAP3 for the four sense amplifier sections SA90 to SA93. In other words, the Nch transistors PCSP, PCSN and the equalizer circuit EQSA are disposed in the margins of the sense amplifier pitches. Consequently, the sense amplifier section, the sense amplifier driver, and the common source line precharge section can be repeatedly disposed every four sense amplifier pitches.

Tenth Embodiment

Figure 12A:
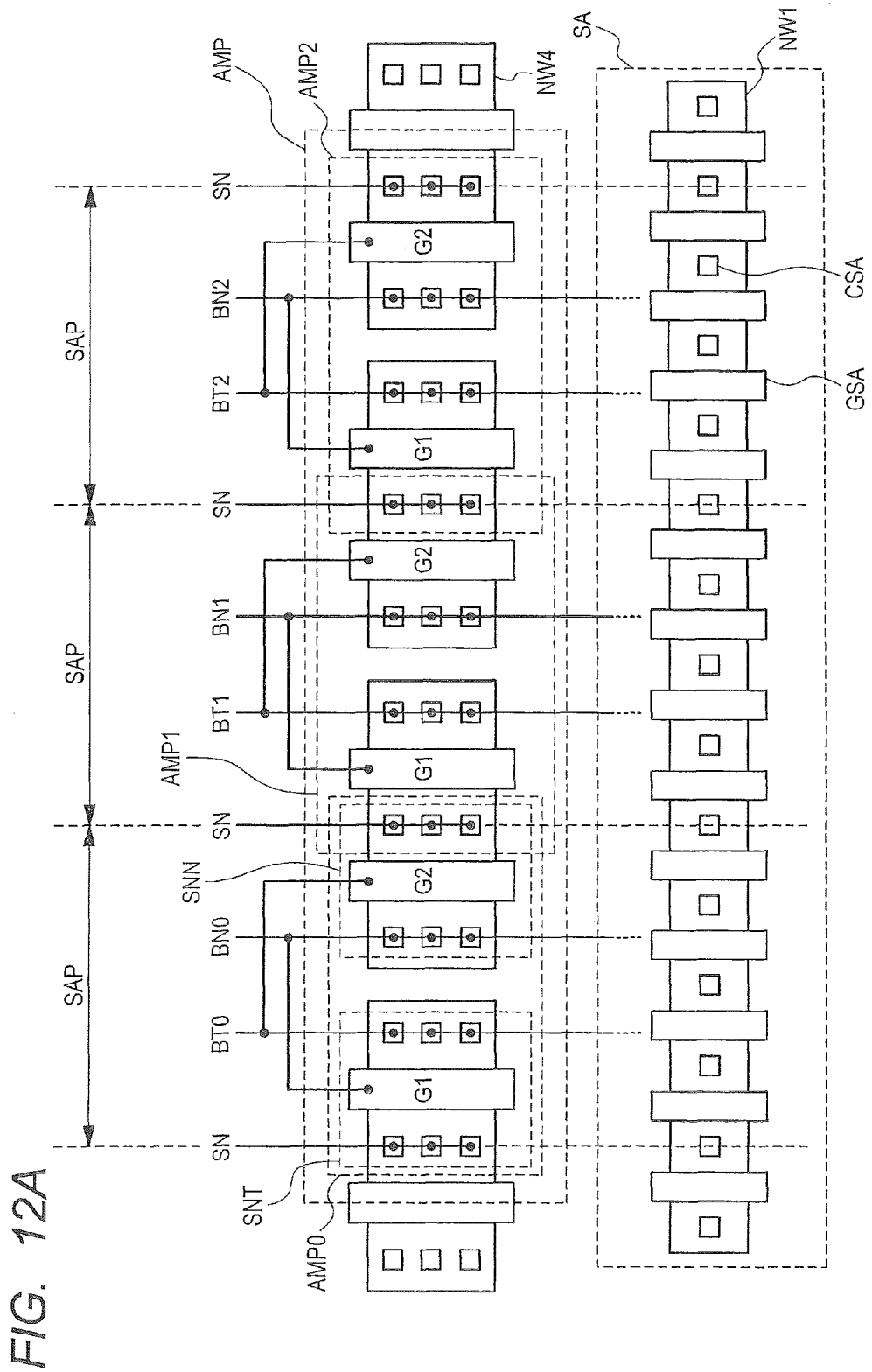
FIG. 12A is a schematic layout diagram illustrating the configuration of essential parts of an amplifier section and sense amplifier section according to a tenth embodiment.

Next, the semiconductor memory device according to a tenth embodiment of the present invention will be described. The semiconductor memory device according to the tenth embodiment will be described with reference to an example in which a different gate arrangement is employed between the amplifier section and a region where the precharge section and Y switch section are formed. FIG. 12A is a schematic layout diagram illustrating the configuration of essential parts in the regions where the amplifier section, precharge section, and Y switch section according to the tenth embodiment are formed. For the sake of brevity, as regards the region SA where the precharge section and Y switch section are formed, FIG. 12A shows only gates GSA, contacts CSA, and n-type diffusion layers NW1 in the region SA where the precharge section and Y switch section are formed. In the region SA where the precharge section and Y switch section are formed, the aforementioned common source line precharge section and sense amplifier driver may be formed.

FIG. 12A shows an example in which amplifier sections AMP0 to AMP2 are disposed in a region AMP where the amplifier sections are disposed. The amplifier sections AMP0 to AMP2 are individually disposed within sense amplifier pitches SAP. For the amplifier sections AMP0 to AMP2, a transistor having a greater gate length and gate width than the sense amplifier sections is employed. The bit lines BT0 to BT2 correspond to the bit line BT in FIG. 1 and are respectively coupled to the amplifier sections AMP0 to AMP2. The bit lines BN0 to BN2 correspond to the bit line BN in FIG. 1 and are respectively coupled to the amplifier sections AMP0 to AMP2.

In the region AMP where the amplifier sections are disposed, n-type diffusion layers NW4 are disposed in the same direction as the n-type diffusion layers NW1 and aligned with each other. The amplifier sections AMP0 to AMP2 include gates G1, G2. The gate G2 is disposed to the right of the gate G1. A region where no gate is disposed exists between the gates G1, G2.

Figure 12B:
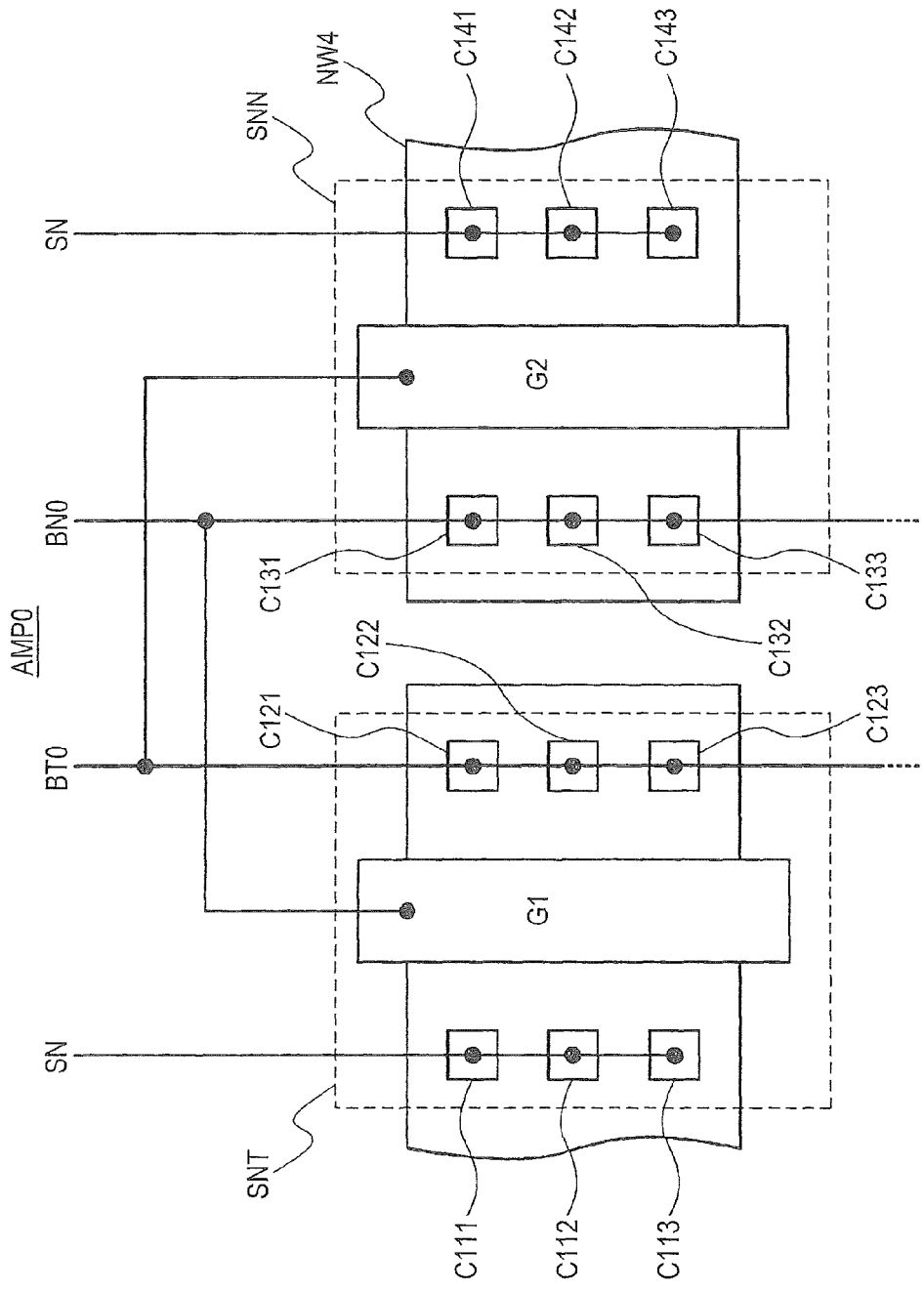
FIG. 12B is a layout diagram illustrating the transistor arrangement of an amplifier section AMP0.

FIG. 12B is a layout diagram illustrating the transistor arrangement of the amplifier section AMP0. Contacts C111 to C113 are positioned to the left of the gate G1, formed over the n-type diffusion layer NW4, and aligned along the gate G1. Contacts C121 to C123 are positioned to the right of the gate G1, formed over the n-type diffusion layer NW4, and aligned along the gate G1. Contacts C131 to C133 are positioned to the left of the gate G2, formed over the n-type diffusion layer NW4, and aligned along the gate G2. Contacts C141 to C143 are positioned to the right of the gate G2, formed over the n-type diffusion layer NW4, and aligned along the gate G2. For the sake of brevity, the contacts C111 to C113, C121 to C123, C131 to C133, C141 to C143 shown in FIG. 12A are not marked with the reference numerals.

The gate G1 and the contacts C131 to C133 are coupled to the bit line BN0. The gate G2 and the contacts C121 to C123 are coupled to the bit line BT0. The contacts C111 to C113 and the contacts C141 to C143 are coupled to the common source line SN.

Hence, the gate G1, the contacts C111 to C113, and the contacts C121 to C123 form the Nch transistor SNT, whereas the gate G2, the contacts C131 to C133, and the contacts C141 to C143 form the Nch transistor SNN.

The amplifier sections AMP1, AMP2 have the same configuration as the amplifier section AMP0. However, the amplifier section AMP1 is coupled to the bit lines BT1, BN instead of the bit lines BT0, BN0 for the amplifier section AMP0. The amplifier section AMP2 is coupled to the bit lines BT2, BN2 instead of the bit lines BT0, BN0 for the amplifier section AMP0. Further, the amplifier sections AMP1, AMP2 share the contacts C141 to C143 of the amplifier sections AMP0, AMP1 as the contacts C111 to C113.

In the configuration described above, regions having different gate lengths and different pitches may coexist. As the above-described configuration discontinuously disposes the gates between the sense amplifier section and the amplifier section, the sense amplifier section can be miniaturized independently of the amplifier section.

Figure 13:
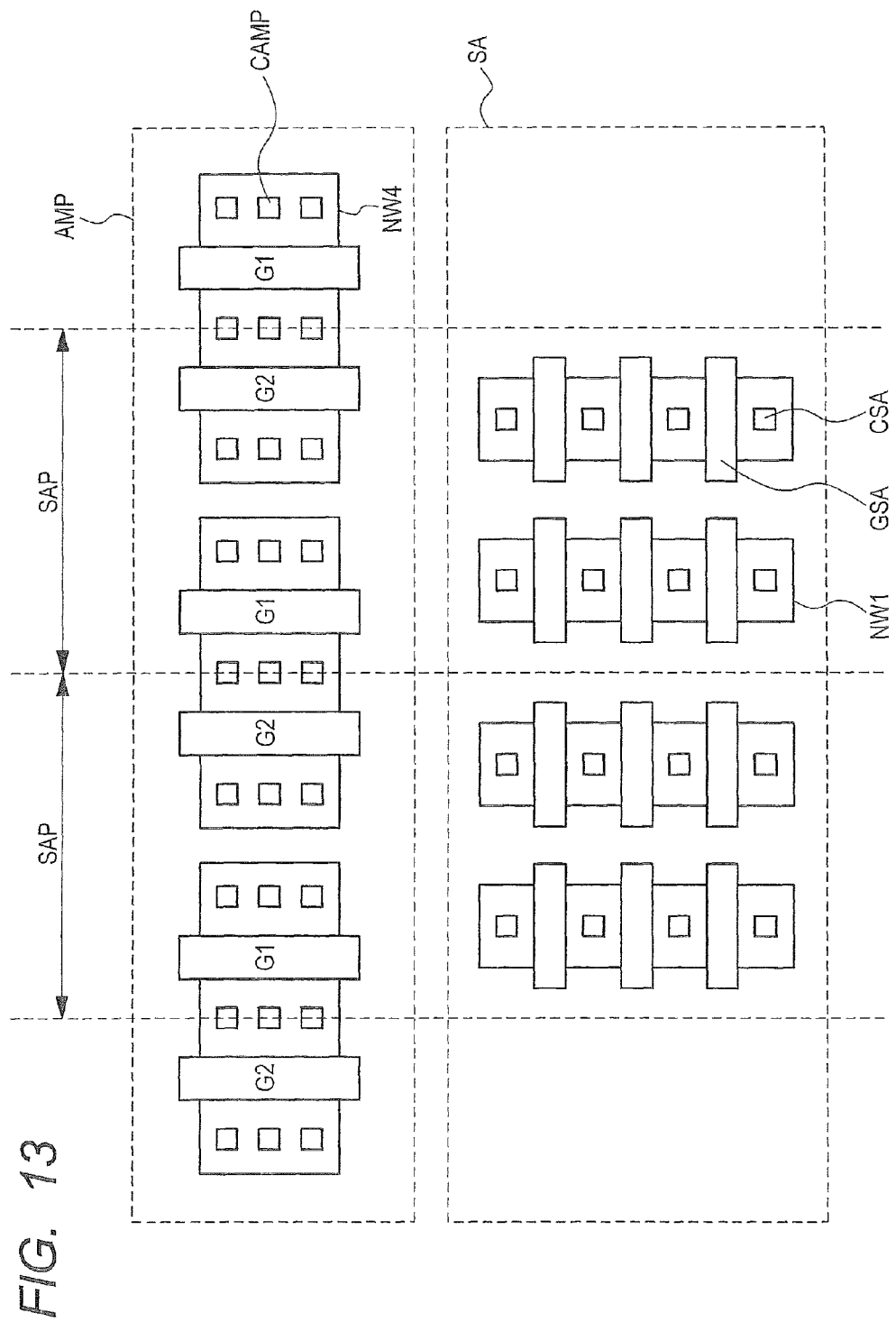
FIG. 13 is a schematic layout diagram illustrating a layout that is used when the gate extension direction of a region SA where a precharge section and Y switch section are formed differs by 90° from the gate extension direction of a region AMP where an amplifier section is disposed.

FIG. 12A shows that the gates in the region SA where the precharge section and the Y switch section are formed are extended in the same direction as the gates in the region AMP where the amplifier section is disposed. However, such a configuration is presented for illustrative purposes only. More specifically, the gates in two regions having different gate widths and pitches may differ by 90° in the direction of extension. For example, the direction of gate extension in the region SA where the precharge section and the Y switch section are formed may differ by 90° from the direction of gate extension in the region AMP where the amplifier section is disposed. FIG. 13 is a schematic layout diagram illustrating a layout that is used when the gate extension direction of the region SA where the precharge section and the Y switch section are formed differs by 90° from the gate extension direction of the region AMP where the amplifier section is disposed. For the sake of brevity, FIG. 13 shows only the n-type diffusion layer NW4, contacts CAMP, and gates G1, G2 in the region AMP where the amplifier section is disposed and the gates GSA, contacts CSA, and n-type diffusion layer NW1 in the region SA where the precharge section and Y switch section are formed. In this case, too, the gates formed in the region SA where the precharge section and Y switch section are formed have the same length and pitch, as is the case with FIG. 12A.

The present invention is not limited to the foregoing embodiments but may be modified as appropriate without departing from the spirit of the present invention. For example, the foregoing embodiments have been described on the assumption that a non-shared sense amplifier is used. However, the present invention is also applicable to a case where a shared sense amplifier is used. A transfer transistor that separates the sense amplifier section from the bit lines may be disposed contiguously to another transistor having the same gate length. Similarly, the present invention is also applicable to a case where an open bit line sense amplifier is used.

Further, the present invention is also applicable to SRAMs, flash memories, and other nonvolatile semiconductor memory devices as far as they permit the sense amplifier section to be disposed in accordance with the repetition pitch of a memory cell.

The configuration of each sense amplifier section described in conjunction with the foregoing embodiments is for illustrative purposes only. More specifically, the layout of each sense amplifier section may be modified as needed by inverting it left to right or upside down or rotating it 180°.

While the present invention contemplated by its inventors has been described in detail in terms of preferred embodiments, it is to be understood that the present invention is not limited to those preferred embodiments, but extends to various modifications that nevertheless fall within the spirit and scope of the appended claims.

What is claimed is:

1. A semiconductor memory device comprising: a sense amplifier section that detects information stored in a memory cell through a bit line; wherein the sense amplifier section includes a plurality of first diffusion layers that are formed over a semiconductor layer and disposed at predetermined intervals in a first direction, a plurality of second diffusion layers that are formed over the semiconductor layer, isolated from the first diffusion layers in a second direction orthogonal to the first direction, and disposed at the predetermined intervals in the first direction, a plurality of first regions that have a predetermined width in the first direction for separating the first diffusion layers from each other, a plurality of second regions that align with the first regions in the second direction and have the predetermined width for separating the second diffusion layers from each other, a plurality of contacts that are formed over the first diffusion layers and over the second diffusion layers, and a plurality of gates that are long in the second direction, formed over one or both of portions of the semiconductor layer that are exposed by the first regions and the second regions.

2. The semiconductor memory device according to claim 1, wherein the gates are shaped like a strip that is long in the second direction.

3. The semiconductor memory device according to claim 1,
wherein the first diffusion layers are formed by a first conductivity type semiconductor; and
wherein the second diffusion layers are formed by a second conductivity type semiconductor, the second conductivity type semiconductor being different from the first conductivity type semiconductor.

4. The semiconductor memory device according to claim 1,
wherein two of the first diffusion layers serve as a drain and a source so that the two of the first diffusion layers and the gates disposed over the semiconductor layer exposed by the first regions form a transistor; and
wherein two of the second diffusion layers serve as a drain and a source so that the two of the second diffusion layers and the gates disposed over the semiconductor layer exposed by the second regions form a transistor.

5. The semiconductor memory device according to claim 1, wherein the memory cell and the sense amplifier section form a DRAM.

6. The semiconductor memory device according to claim 1, wherein the sense amplifier section includes a precharge circuit that equalizes the potentials of a pair of a first bit line and a second bit line in accordance with a first control signal, and a Y switch section that couples the first bit line to a first bus line and the second bit line to a second bus line in accordance with a second control signal.

7. The semiconductor memory device according to claim 6,
wherein the precharge circuit includes a first transistor that is coupled at one end to the first bit line and at the other end to a first power supply, a second transistor that is coupled at one end to the second bit line and at the other end to the first power supply, and an equalizer circuit that is coupled at one end to the first bit line and at the other end to the second bit line;
wherein the Y switch section includes a third transistor that is coupled at one end to the first bit line and at the other end to the first bus line, and a fourth transistor that is coupled at one end to the second bit line and at the other end to the second bus line;
wherein the first control signal is applied to control terminals of the first and second transistors and of the equalizer circuit; and
wherein the second control signal is applied to control terminals of the third and fourth transistors.

8. The semiconductor memory device according to claim 7,
wherein the gates include first to fifth gates;
wherein the contacts include first to eighth contacts;
wherein the first gate is formed over the semiconductor layer exposed by the first regions;
wherein the third gate is formed over the semiconductor layer exposed by the first region adjacent to the first gate and over the semiconductor layer exposed by the second regions;
wherein the second gate is formed over the semiconductor layer exposed by the second region that is positioned adjacent to the third gate and toward the first gate;
wherein the fourth gate is formed over the semiconductor layer exposed by the first region that faces the first gate through the third gate;
wherein the fifth gate is formed over the semiconductor layer exposed by the second region that faces the second gate through the third gate;
wherein the first contact is formed over the first diffusion layer that is positioned adjacent to the first gate and opposite the third gate;
wherein the second contact is formed over the first diffusion layer between the first gate and the third gate;
wherein the third contact is formed over the first diffusion layer between the third gate and the fourth gate;
wherein the fourth contact is formed over the first diffusion layer that faces the third contact through the fourth gate;
wherein the fifth contact is formed over the second diffusion layer that is positioned adjacent to the second gate and opposite the third gate;
wherein the sixth contact is formed over the second diffusion layer between the second gate and the third gate;
wherein the seventh contact is formed over the second diffusion layer between the third gate and the fifth gate; and
wherein the eighth contact is formed over the second diffusion layer that faces the seventh contact through the fifth gate.

9. The semiconductor memory device according to claim 8,
wherein the first gate receives the first control signal as the gate of the first transistor;
wherein the second gate receives the second control signal as the gate of the third transistor;
wherein the third gate receives the first control signal as the gate of a transistor forming the equalizer circuit;
wherein the fourth gate receives the first control signal as the gate of the second transistor;
wherein the fifth gate receives the second control signal as the gate of the fourth transistor;
wherein the first contact is coupled to the first power supply as one of the source and drain of the first transistor;
wherein the second contact is coupled to the first bit line as the other of the source and drain of the first transistor and as one of the source and drain of the transistor forming the equalizer circuit that are disposed over the first diffusion layers;
wherein the third contact is coupled to the second bit line as one of the source and drain of the second transistor and as the other of the source and drain of the transistor forming the equalizer circuit that are disposed over the first diffusion layers;
wherein the fourth contact is coupled to the first power supply as the other of the source and drain of the second transistor;
wherein the fifth contact is coupled to the first bus line as one of the source and drain of the third transistor;
wherein the sixth contact is coupled to the first bit line as the other of the source and drain of the third transistor and as one of the source and drain of the transistor forming the equalizer circuit that are disposed over the second diffusion layers;
wherein the seventh contact is coupled to the second bit line as one of the source and drain of the fourth transistor and as the other of the source and drain of the transistor forming the equalizer circuit that are disposed over the second diffusion layers; and
wherein the eighth contact is coupled to the second bus line as the other of the source and drain of the fourth transistor.

10. The semiconductor memory device according to claim 8,
wherein the first gate receives the second control signal as the gate of the third transistor;
wherein the second gate receives the first control signal as the gate of the first transistor;
wherein the third gate receives the first control signal as the gate of a transistor forming the equalizer circuit;
wherein the fourth gate receives the first control signal as the gate of the second transistor;
wherein the fifth gate receives the second control signal as the gate of the fourth transistor;
wherein the first contact is coupled to the first bus line as one of the source and drain of the third transistor;
wherein the second contact is coupled to the first bit line as the other of the source and drain of the third transistor and as one of the source and drain of the transistor forming the equalizer circuit that are disposed over the first diffusion layers;
wherein the third contact is coupled to the second bit line as one of the source and drain of the second transistor and as the other of the source and drain of the transistor forming the equalizer circuit that are disposed over the first diffusion layers;
wherein the fourth contact is coupled to the first power supply as the other of the source and drain of the second transistor;
wherein the fifth contact is coupled to the first power supply as one of the source and drain of the first transistor;
wherein the sixth contact is coupled to the first bit line as the other of the source and drain of the first transistor and as one of the source and drain of the transistor forming the equalizer circuit that are disposed over the second diffusion layers;
wherein the seventh contact is coupled to the second bit line as one of the source and drain of the fourth transistor and as the other of the source and drain of the transistor forming the equalizer circuit that are disposed over the second diffusion layers; and
wherein the eighth contact is coupled to the second bus line as the other of the source and drain of the fourth transistor.

11. The semiconductor memory device according to claim 7,
wherein the gates include first to third gates;
wherein the contacts include first to eighth contacts;
wherein the first gate is formed over the semiconductor layer exposed by the first regions and over the semiconductor layer exposed by the second regions, and receives the second control signal as the gates of the third and fourth transistors;
wherein the second gate is formed over the semiconductor layer exposed by the first region adjacent to the first gate and over the semiconductor layer exposed by the second regions, and receives the first control signal as the gate of a transistor forming the equalizer circuit;

wherein the third gate is formed over the semiconductor layer exposed by the first region that faces the first gate through the second gate, is formed over the semiconductor layer exposed by the second regions, and receives the first control signal as the gates of the first and second transistors;

wherein the first contact is formed over the first diffusion layer that is positioned adjacent to the first gate and opposite the second gate, and coupled to the first bus line as one of the source and drain of the third transistor;

wherein the second contact is formed over the first diffusion layer between the first gate and the second gate, and coupled to the first bit line as the other of the source and drain of the third transistor and as one of the source and drain of the transistor forming the equalizer circuit that are disposed over the first diffusion layers;

wherein the third contact is formed over the first diffusion layer between the second gate and the third gate and coupled to the second bit line as one of the source and drain of the second transistor and as the other of the source and drain of the transistor forming the equalizer circuit that are disposed over the first diffusion layers;

wherein the fourth contact is formed over the first diffusion layer that faces the third contact through the third gate, and coupled to the first power supply as the other of the source and drain of the second transistor;

wherein the fifth contact is formed over the second diffusion layer that is positioned adjacent to the first gate and opposite the second gate, and coupled to the second bus line as one of the source and drain of the fourth transistor;

wherein the sixth contact is formed over the second diffusion layer between the first gate and the second gate, and coupled to the second bit line as the other of the source and drain of the fourth transistor and as one of the source and drain of the transistor forming the equalizer circuit that are disposed over the second diffusion layers;

wherein the seventh contact is formed over the second diffusion layer between the second gate and the third gate, and coupled to the first bit line as one of the source and drain of the first transistor and as the other of the source and drain of the transistor forming the equalizer circuit that are disposed over the second diffusion layers; and wherein the eighth contact is formed over the second diffusion layer that faces the seventh contact through the third gate, and coupled to the first power supply as the other of the source and drain of the first transistor.

12. The semiconductor memory device according to claim 7,
wherein the Y switch section further includes a fifth transistor that is coupled between the third transistor and the first bus line, and a sixth transistor that is coupled between the fourth transistor and the second bus line;
wherein the gates include first to fourth gates;
wherein the contacts include first to eighth contacts;
wherein the first gate is formed over the semiconductor layer exposed by the first regions and over the semiconductor layer exposed by the second regions, and receives a third control signal as the gates of the fifth and sixth transistors;
wherein the second gate is formed over the semiconductor layer exposed by the first region adjacent to the first gate and over the semiconductor layer exposed by the second regions, and receives the second control signal as the gates of the third and fourth transistors;

wherein the third gate is formed over the semiconductor layer exposed by the first region that faces the first gate through the second gate, is formed over the semiconductor layer exposed by the second regions, and receives the first control signal as the gate of the transistor forming the equalizer circuit;

wherein the fourth gate is formed over the semiconductor layer exposed by the first region that faces the second gate through the third gate, is formed over the semiconductor layer exposed by the second regions, and receives the first control signal as the gates of the first and second transistors;

wherein the first contact is formed over the first diffusion layer that is positioned adjacent to the first gate and opposite the second gate, and coupled to the first bus line as one of the source and drain of the fifth transistor;

wherein the second contact is formed over the first diffusion layer between the second gate and the third gate, and coupled to the first bit line as one of the source and drain of the third transistor and as one of the source and drain of the transistor forming the equalizer circuit that are disposed over the first diffusion layers;

wherein the first diffusion layer between the first gate and the second gate is shared as the other of the source and drain of the fifth transistor and as the other of the source and drain of the third transistor;

wherein the third contact is formed over the first diffusion layer between the third gate and the fourth gate, and coupled to the second bit line as the other of the source and drain of the transistor forming the equalizer circuit that are disposed over the first diffusion layers and as one of the source and drain of the second transistor;

wherein the fourth contact is formed over the first diffusion layer that faces the third contact through the fourth gate, and coupled to the first power supply as the other of the source and drain of the second transistor;

wherein the fifth contact is formed over the second diffusion layer that is positioned adjacent to the first gate and opposite the second gate, and coupled to the second bus line as one of the source and drain of the sixth transistor;

wherein the sixth contact is formed over the second diffusion layer between the second gate and the third gate, and coupled to the second bit line as one of the source and drain of the fourth transistor and as one of the source and drain of the transistor forming the equalizer circuit that are disposed over the second diffusion layers;

wherein the second diffusion layer between the first gate and the second gate is shared as the other of the source and drain of the sixth transistor and as the other of the source and drain of the fourth transistor;

wherein the seventh contact is formed over the second diffusion layer between the third gate and the fourth gate, and coupled to the first bit line as the other of the source and drain of the transistor forming the equalizer circuit that are disposed over the second diffusion layers and as one of the source and drain of the first transistor; and wherein the eighth contact is formed over the second diffusion layer that faces the seventh contact through the fourth gate, and coupled to the first power supply as the other of the source and drain of the first transistor.

13. The semiconductor memory device according to claim 7,
- wherein the gates include first to seventh gates;
- wherein the contacts include first to eighth contacts;
- wherein the first gate is formed over the semiconductor layer exposed by the first regions, and receives the first control signal as the gate of the first transistor;
- wherein the second gate is formed over the semiconductor layer exposed by the first region adjacent to the first gate and receives the second control signal as the gate of the third transistor;
- wherein the third gate is formed over the semiconductor layer exposed by the first region that faces the first gate through the second gate, and receives the second control signal as the gate of the third transistor;
- wherein the fourth gate is formed over the semiconductor layer exposed by the first region that faces the second gate through the third gate, and receives the first control signal as the gate of a transistor forming the equalizer circuit;
- wherein the fifth gate is formed over the semiconductor layer exposed by the first region that faces the third gate through the fourth gate, and receives the second control signal as the gate of the fourth transistor;
- wherein the sixth gate is formed over the semiconductor layer exposed by the first region that faces the fourth gate through the fifth gate, and receives the second control signal as the gate of the fourth transistor;
- wherein the seventh gate is formed over the semiconductor layer exposed by the first region that faces the fifth gate through the sixth gate, and receives the first control signal as the gate of the second transistor;
- wherein the first contact is formed over the first diffusion layer that is positioned adjacent to the first gate and opposite the second gate, and coupled to the first power supply as one of the source and drain of the first transistor;
- wherein the second contact is formed over the first diffusion layer between the first gate and the second gate, and coupled to the first bit line as the other of the source and drain of the first transistor and as a first terminal that is one of the source and drain of the third transistor;
- wherein the third contact is formed over the first diffusion layer between the second gate and the third gate, and coupled to the first bus line as the other of the source and drain of the third transistor;
- wherein the fourth contact is formed over the first diffusion layer between the third gate and the fourth gate, and coupled to the first bit line as the first terminal of the first transistor and as one of the source and drain of the transistor forming the equalizer circuit;
- wherein the fifth contact is formed over the first diffusion layer between the fourth gate and the fifth gate, and coupled to the second bit line as the other of the source and drain of the transistor forming the equalizer circuit and as a second terminal that is one of the source and drain of the fourth transistor;
- wherein the sixth contact is formed over the first diffusion layer between the fifth gate and the sixth gate, and coupled to the second bus line as the other of the source and drain of the fourth transistor;
- wherein the seventh contact is formed over the first diffusion layer between the sixth gate and the seventh gate, and coupled to the second bit line as the second terminal of the fourth transistor and as one of the source and drain of the second transistor; and
- wherein the eighth contact is formed over the first diffusion layer that faces the seventh contact through the seventh gate, and coupled to the first power supply as the other of the source and drain of the second transistor.

14. The semiconductor memory device according to claim 7,
- wherein the gates include first to sixth gates;
- wherein the contacts include first to ninth contacts;
- wherein the first gate is formed over the semiconductor layer exposed by the first regions and over the semiconductor layer exposed by the second regions, and receives the first control signal as the gates of the first and second transistors;
- wherein the second gate is formed over the semiconductor layer exposed by the first region adjacent to the first gate, and receives the second control signal as the gate of the third transistor;
- wherein the third gate is formed over the semiconductor layer exposed by the first region that faces the first gate through the second gate, and receives the second control signal as the gate of the third transistor;
- wherein the fourth gate is formed over the semiconductor layer exposed by the first region that faces the second gate through the third gate, and receives the first control signal as the gate of a transistor forming the equalizer circuit;
- wherein the fifth gate is formed over the semiconductor layer exposed by the second region that is positioned adjacent to the first gate and toward the second gate, and receives the second control signal as the gate of the fourth transistor;
- wherein the sixth gate is formed over the semiconductor layer exposed by the second region that faces the first gate through the fifth gate, and receives the second control signal as the gate of the fourth transistor;
- wherein the first contact is formed over the first diffusion layer that is positioned adjacent to the first gate and opposite the second gate, and coupled to the first power supply as one of the source and drain of the first transistor;
- wherein the second contact is formed over the first diffusion layer between the first gate and the second gate, and coupled to the first bit line as the other of the source and drain of the first transistor and as a first terminal that is one of the source and drain of the third transistor;
- wherein the third contact is formed over the first diffusion layer between the second gate and the third gate, and coupled to the first bus line as the other of the source and drain of the third transistor;
- wherein the fourth contact is formed over the first diffusion layer between the third gate and the fourth gate, and coupled to the first bit line as the first terminal of the first transistor and as one of the source and drain of the transistor forming the equalizer circuit;
- wherein the fifth contact is formed over the first diffusion layer that faces the fourth contact through the fourth gate, and coupled to the second bit line as the other of the source and drain of the transistor forming the equalizer circuit;
- wherein the sixth contact is formed over the second diffusion layer that is positioned adjacent to the first gate and opposite the second gate, and coupled to the first power supply as one of the source and drain of the second transistor;
- wherein the seventh contact is formed over the second diffusion layer between the first gate and the fifth gate, and coupled to the second bit line as the other of the source and drain of the second transistor and as a second terminal that is one of the source and drain of the fourth transistor;

wherein the eighth contact is formed over the second diffusion layer between the fifth gate and the sixth gate, and coupled to the second bus line as the other of the source and drain of the fourth transistor; and wherein the ninth contact is formed over the second diffusion layer that faces the eighth contact through the sixth contact, and coupled to the second bit line as the second terminal of the fourth transistor.

15. The semiconductor memory device according to claim 7, wherein the sense amplifier section includes a first sense amplifier section and a second sense amplifier section;

wherein the gates of the first and second sense amplifier sections include first to fourth gates;

wherein the contacts of the first and second sense amplifier sections include first to seventh contacts;

wherein the first gate is formed over the semiconductor layer exposed by the first regions;

wherein the second gate is formed over the semiconductor layer exposed by the first region adjacent to the first gate and over the semiconductor layer exposed by the second regions;

wherein the third gate is formed over the semiconductor layer exposed by the first region that faces the first gate through the second gate;

wherein the fourth gate is formed over the semiconductor layer exposed by the first region that faces the second gate through the third gate;

wherein the first contact is formed over the first diffusion layer that is positioned adjacent to the first gate and opposite the second gate;

wherein the second contact is formed over the first diffusion layer between the first gate and the second gate;

wherein the third contact is formed over the first diffusion layer between the second gate and the third gate;

wherein the fourth contact is formed over the first diffusion layer between the third gate and the fourth gate;

wherein the fifth contact is formed over the first diffusion layer that faces the fourth contact through the fourth gate;

wherein the sixth contact is formed over the second diffusion layer that is positioned adjacent to the first gate and opposite the second gate;

wherein the seventh contact is formed over the second diffusion layer that faces the sixth contact through the second gate;

wherein the second sense amplifier section is disposed at a position rotated 180° around the center of the seventh contact of the first sense amplifier section;

wherein the second diffusion layer over which the seventh contact of the first sense amplifier section is formed and the second diffusion layer over which the seventh contact of the second sense amplifier section is formed are adjacent to each other in the first direction with one of the second regions in between;

wherein the first gate of the first sense amplifier section receives the second control signal as the gate of the third transistor;

wherein the second gate of the first sense amplifier section receives the first control signal as the gates of the first transistor and of a transistor forming the equalizer circuit;

wherein the third gate of the first sense amplifier section receives the first control signal as the gate of the second transistor;

wherein the fourth gate of the first sense amplifier section receives the second control signal as the gate of the fourth transistor;

wherein the first contact of the first sense amplifier section is coupled to the first bus line as one of the source and drain of the third transistor;

wherein the second contact of the first sense amplifier section is coupled to the first bit line as the other of the source and drain of the third transistor and as one of the source and drain of the first transistor;

wherein the third contact of the first sense amplifier section is coupled to the first power supply as the other of the source and drain of the first transistor and as one of the source and drain of the second transistor;

wherein the fourth contact of the first sense amplifier section is coupled to the second bit line as the other of the source and drain of the second transistor and as one of the source and drain of the fourth transistor;

wherein the fifth contact of the first sense amplifier section is coupled to the second bus line as the other of the source and drain of the fourth transistor;

wherein the sixth contact of the first sense amplifier section is coupled to the first bit line as one of the source and drain of the transistor forming the equalizer circuit;

wherein the seventh contact of the first sense amplifier section is coupled to the second bit line as the other of the source and drain of the transistor forming the equalizer circuit;

wherein the first gate of the second sense amplifier section receives a fifth control signal as the gate of the third transistor;

wherein the second gate of the second sense amplifier section receives a fourth control signal as the gates of the first transistor and of a transistor forming the equalizer circuit;

wherein the third gate of the second sense amplifier section receives the fourth control signal as the gate of the second transistor;

wherein the fourth gate of the second sense amplifier section receives the fifth control signal as the gate of the fourth transistor;

wherein the first contact of the second sense amplifier section is coupled to the first bus line as one of the source and drain of the third transistor;

wherein the second contact of the second sense amplifier section is coupled to a fourth bit line as the other of the source and drain of the third transistor and as one of the source and drain of the first transistor;

wherein the third contact of the second sense amplifier section is coupled to the first power supply as the other of the source and drain of the first transistor and as one of the source and drain of the second transistor;

wherein the fourth contact of the second sense amplifier section is coupled to a third bit line as the other of the source and drain of the second transistor and as one of the source and drain of the fourth transistor;

wherein the fifth contact of the second sense amplifier section is coupled to the second bus line as the other of the source and drain of the fourth transistor;

wherein the sixth contact of the second sense amplifier section is coupled to the fourth bit line as one of the source and drain of the transistor forming the equalizer circuit; and wherein the seventh contact of the second sense amplifier section is coupled to the third bit line as the other of the source and drain of the transistor forming the equalizer circuit.

16. The semiconductor memory device according to claim 7, further comprising:
a sense amplifier driver that controls the sense amplifier section;
wherein the sense amplifier section further includes an amplifier section that is activated by the sense amplifier driver through a first common line to amplify the voltages of the first bit line and of the second bit line;
wherein the sense amplifier driver includes a fifth transistor that is coupled at one end to the first common line and at the other end to a second power supply, and receives a first sense amplifier control signal at a control terminal thereof;
wherein the gates include a first gate;
wherein the contacts include a first contact and a second contact;
wherein the first gate is formed over the semiconductor layer exposed by the first regions, and receives the first sense amplifier control signal as the gate of the fifth transistor;
wherein the first contact is formed over the first diffusion layer adjacent to the first gate, and coupled to the first common line as one of the source and drain of the fifth transistor; and
wherein the second contact is formed over the first diffusion layer that faces the first contact through the first gate, and coupled to the second power supply as the other of the source and drain of the fifth transistor.

17. The semiconductor memory device according to claim 16,
wherein the sense amplifier driver further includes a sixth transistor that is coupled at one end to a second common line and at the other end to a third power supply, and receives a second sense amplifier control signal at a control terminal thereof;
wherein the sixth transistor differs in conductivity type from the fifth transistor; and
wherein the second sense amplifier control signal is an inversion of the first sense amplifier control signal.

18. The semiconductor memory device according to claim 17, further comprising:
a common line precharge circuit that precharges the first and second common lines;
wherein the common line precharge circuit includes
a seventh transistor that is coupled at one end to the first common line and at the other end to the first power supply, and receives the first control signal at a control terminal thereof,
an eighth transistor that is coupled at one end to the second common line and at the other end to the first power supply, and receives the first control signal at a control terminal thereof, and
a ninth transistor that is coupled at one end to the first common line and at the other end to the second common line, and receives the first control signal at a control terminal thereof;
wherein the gates include second to fourth gates;
wherein the contacts include third to sixth contacts;

wherein the second gate is formed over the semiconductor layer exposed by the first regions, and receives the first control signal as the gate of the seventh transistor;
wherein the third gate is formed over the semiconductor layer exposed by the second region adjacent to the second gate, and receives the first control signal as the gate of the ninth transistor;
wherein the fourth gate is formed over the semiconductor layer exposed by the second region that faces the second gate through the third gate, and receives the first control signal as the gate of the eighth transistor;
wherein the third contact is formed over the second diffusion layer that is positioned adjacent to the second gate and opposite the third gate, and coupled to the first power supply as one of the source and drain of the seventh transistor;
wherein the fourth contact is formed over the second diffusion layer between the second gate and the third gate, and coupled to the first common line as the other of the source and drain of the seventh transistor and as one of the source and drain of the ninth transistor;
wherein the fifth contact is formed over the second diffusion layer between the third gate and the fourth gate, and coupled to the second common line as the other of the source and drain of the ninth transistor and as one of the source and drain of the eighth transistor; and
wherein the sixth contact is formed over the second diffusion layer that faces the fifth contact through the fourth gate, and coupled to the first power supply as the other of the source and drain of the eighth transistor.

19. The semiconductor memory device according to claim 17,
wherein the amplifier section includes a seventh transistor that is coupled at one end to the first common line, coupled at the other end to the first bit line, and coupled at a control terminal thereof to the second bit line, an eighth transistor that is coupled at one end to the second common line, coupled at the other end to the first bit line, coupled at a control terminal thereof to the second bit line, and different in conductivity type from the seventh transistor, a ninth transistor that is coupled at one end to the first common line, coupled at the other end to the second bit line, coupled at a control terminal thereof to the first bit line, and equal in conductivity type to the seventh transistor, a tenth transistor that is coupled at one end to the second common line, coupled at the other end to the second bit line, coupled at a control terminal thereof to the first bit line, and different in conductivity type from the seventh transistor, and a plurality of amplifier section gates;
wherein channel layers of the seventh and ninth transistors are formed over the semiconductor layer exposed by a plurality of third regions having a predetermined width for mutually separating a plurality of third diffusion layers that are equal in conductivity type to the first and second diffusion layers;
wherein the third diffusion layers are isolated from the first and second diffusion layers in the second direction and disposed over the semiconductor layer at predetermined intervals in the first direction; and
wherein the amplifier section gates are long in the second direction and formed over the semiconductor layer exposed by the third regions.

20. The semiconductor memory device according to claim 19,
  wherein the intervals between the third regions are longer than the intervals between the first regions and between the second regions; and
  wherein the gate length in the first direction of the amplifier section gates are greater than the gate length in the first direction of the gates.

* * * * *